United States Patent
Clerk et al.

(10) Patent No.: US 12,276,710 B2
(45) Date of Patent: Apr. 15, 2025

(54) QUANTUM SPIN AMPLIFICATION

(71) Applicant: The University of Chicago, Chicago, IL (US)

(72) Inventors: Aashish Clerk, Chicago, IL (US); Martin Koppenhöfer, Chicago, IL (US); Peter Groszkowski, Knoxville, TN (US)

(73) Assignee: The University of Chicago, Chicago, IL (US)

( * ) Notice: Subject to any disclaimer, the term of this patent is extended or adjusted under 35 U.S.C. 154(b) by 331 days.

(21) Appl. No.: 18/057,807

(22) Filed: Nov. 22, 2022

(65) Prior Publication Data

US 2023/0194634 A1    Jun. 22, 2023

Related U.S. Application Data

(60) Provisional application No. 63/264,617, filed on Nov. 29, 2021.

(51) Int. Cl.
*G01R 33/00* (2006.01)
*G01R 33/12* (2006.01)

(52) U.S. Cl.
CPC ..... *G01R 33/0029* (2013.01); *G01R 33/1284* (2013.01)

(58) Field of Classification Search
CPC .......................... G01R 33/0029; G01R 33/1284
USPC ...................................................... 324/225
See application file for complete search history.

(56) References Cited

U.S. PATENT DOCUMENTS

2020/0049776 A1 * 2/2020 Wood .................. G01R 33/307

OTHER PUBLICATIONS

Koppenhöfer, Martin, et al. "Dissipative superradiant spin amplifier for enhanced quantum sensing." PRX Quantum 3.3 (2022): 030330. (Year: 2022).*
Nicholas E. Rehler et al., Superradiance, Physical Review A, vol. 3, No. 5, May 1971. pp. 1735-1751.
Agarwal, Master-Equation Approach to Spontaneous Emission. III. Many-Body Aspects of Emission from Two-Level Atoms and the Effect of Inhomogeneous Broadening, Physical Review A, vol. 4, No. 5, Nov. 1971, pp. 1791-1801.

(Continued)

*Primary Examiner* — Christopher P McAndrew
(74) *Attorney, Agent, or Firm* — Cozen O'Connor

(57) ABSTRACT

A method for quantum spin amplification includes spin-polarizing an ensemble of quantum spins in an initial spin state to generate a transversely-polarized sensing spin state. The quantum spins identically have an upper energy state and a lower energy state. The sensing spin state accumulates a phase shift that transforms the sensing spin state into a phase-accumulated spin state having first and second transverse polarization components. The phase-accumulated spin state is transformed into an intermediate spin state by rotating the first transverse polarization component into a longitudinal polarization component of the intermediate spin state. The ensemble is then coupled to an auxiliary mode, during which the intermediate spin state evolves such that the second transverse polarization component is amplified into an amplified transverse polarization. This amplified transverse polarization is then measured.

20 Claims, 9 Drawing Sheets

(56) References Cited

OTHER PUBLICATIONS

Angerer et al., Superradiant Emission from Colour Centres in Diamond, Nature Physics, Letters, https://doi.org/10.1038/s41567-018-0269-7, 7 pages.

Jonathan Keeling, Quantum Corrections to the Semiclassical Collective Dynamics in the Tavis-Cummings Model, arXiv:0901.4245v2 [cond-mat.str-el] Mar. 31, 2009, 7 pages.

Eisenach, et al., Cavity-Enhanced Microwave Readout of a Solid-State Spin Sensor, Nature Communications, https://doi.org/10.1038/s41467-021-21256-7, 7 pages.

Agarwal, Master-Equation Approach to Spontaneous Emission, Physical Review A, vol. 2, No. 5, Nov. 1970, 9 pages.

Garraway, The Dicke Model in Quantum Optics: Dicke Model Revisited, Philosophical Transactions of The Royal Society A, 2011, 369, 1137-1155.

Dicke, Coherence in Spontaneous Radiation Processes, Physical Review, vol. 93, No. 1, Jan. 1, 1954, 12 pages.

Barry et al., Sensitivity Optimization for NV-Diamond Magnetometry, arXiv:1903.08176v2 [quant-ph] May 28, 2020, 73 pages.

Davis et al., Approaching the Heisenberg Limit Without Single-Particle Detection, arXiv:1508.04110v2 [quant-ph] Jan. 28, 2016, 9 pages.

\* cited by examiner

ID number US 12,276,710 B2

QUANTUM SPIN AMPLIFICATION

RELATED APPLICATIONS

This application claims priority to U.S. Provisional Patent Application No. 63/264,617, titled "Quantum Spin Amplifier and Associated Methods" and filed on Nov. 29, 2021, which is incorporated herein by reference in its entirety.

STATEMENT REGARDING FEDERALLY SPONSORED RESEARCH OR DEVELOPMENT

This invention was made with government support under grant number D18AC00014 awarded by the Department of Defense. The government has certain rights in the invention.

BACKGROUND

Quantum sensing uses the properties of quantum states of light and matter to develop new measurement strategies. Within this broad field, the most ubiquitous class of sensors are ensembles of two-level systems. Such sensors have been realized in a variety of platforms, including atomic ensembles in cavity QED systems [1-3], and collections of defect spins in semiconductor materials [4-7]. They have also been employed to measure a multitude of diverse sensing targets, ranging from magnetometry [8,9] to the sensing of electric fields [10] and even temperature [11].

SUMMARY

Quantum metrology protocols based ensembles of N two-level systems and Ramsey-style measurements are ubiquitous. However, in many cases excess readout noise severely degrades the measurement sensitivity; in particular in sensors based on ensembles of solid-state defect spins. The present embodiments include systems and methods for "quantum spin amplification" that can dramatically improve the sensitivity of such schemes, even in the presence of realistic intrinsic dissipation and noise. The present embodiments utilize collective (i.e., superradiant) spin decay, an effect that is usually seen as a nuisance because it limits spin-squeezing protocols. With the present embodiments, a system with an imperfect spin readout can approach the standard quantum limit (SQL) to within a factor of two, without needing to change the actual readout mechanism. The present embodiments may be implemented with any of several experimental platforms in which an ensemble of spins is coupled to a common electromagnetic or mechanical mode.

DETAILED DESCRIPTION

I. Introduction

Figure 1A:
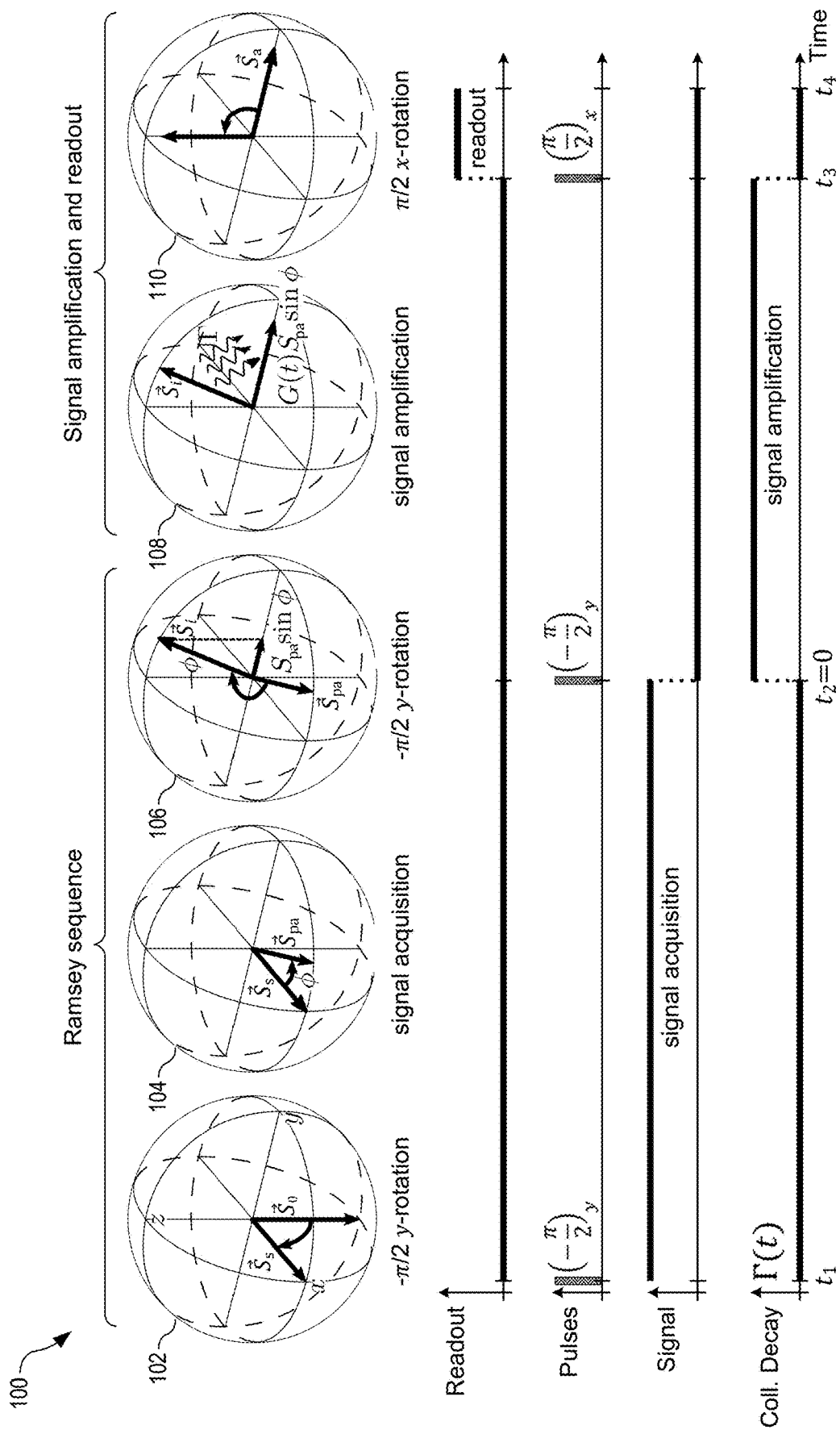
FIG. 1A illustrates a method for quantum spin amplification, in embodiments.

Finding new strategies to improve quantum sensors could have an extremely wide impact. A general and well-explored method here is to use collective spin-spin interactions to generate entanglement, with the prototypical example being the creation of spin-squeezed states. The intrinsic fluctuations of such states can be parametrically smaller than those of a simple product state [12-14], allowing in principle dramatic improvements in sensitivity.

Spin squeezing ultimately uses entanglement to suppress fundamental spin projection noise. However, this is only a useful strategy in settings where the extrinsic measurement noise associated with the readout of the spin ensemble is smaller than the intrinsic quantum noise of the ensemble's quantum state [14,15]. While this limit of ideal readout can be approached in atomic platforms, typical solid-state spin sensors (e.g., ensembles of nitrogen vacancy (NV) defect center spins that are read out using spin-dependent fluorescence) have measurement noise that is orders of magnitude higher than the fundamental intrinsic quantum noise [16]. Thus, in solid-state spin sensors with fluorescence readout, both reducing the readout noise down to the standard quantum limit (SQL) and (in a subsequent step) surpassing the SQL (e.g., using spin squeezing) are major open milestones. Many experimental efforts have been made to achieve the first one by changing the readout mechanism of the spins [17-21]. This strategy typically works well for single or few spins, but projection-noise limited readout of a large ensemble still remains an open problem [16].

The present embodiments use a different approach to reach the first milestone in spin ensembles: starting from extremely large readout noise that is several orders of magnitude above the SQL, the approach reduces the effective readout noise down to a factor of two above the SQL, notably without changing the actual fluorescence readout protocol. We stress that the present embodiments do not use spin-squeezed initial states and sensitivities beyond the SQL, although the present embodiments could be extended in this way to approach the Heisenberg limit (HL).

In situations where measurement noise is the key limitation, a potentially more powerful approach than spin squeezing is the complementary strategy of amplification: before performing readout, increase the magnitude of the "signal" encoded in the spin ensemble. The amplification then effectively reduces the imprecision resulting from any following measurement noise. This strategy is well known in quantum optics [22,23] and is standard when measuring weak electromagnetic signals. Different amplification mechanisms have been proposed [24,25], but amplification was only recently studied in the spin context [26-32]. Davis et al. [26,29] demonstrated that the same collective spin-spin interaction commonly used for spin squeezing (the so-called one-axis twist (OAT) interaction) could be harnessed for amplification. In the absence of dissipation, they showed that their approach allowed near Heisenberg-limited measurement despite having measurement noise that was on par with the projection noise of an unentangled state. This scheme, which can be viewed as a kind of more general "interaction-based readout" protocol [31,33-35], has been implemented in cavity QED [3], Bose-condensed cold-atom systems [36], and atoms trapped in an optical lattice [37]; a similar strategy was also used to amplify the displacement of a trapped ion [38].

Unfortunately, despite its success in a variety of atomic platforms, the amplification scheme of Ref [26] is ineffective in setups where the spin ensemble consists of simple two-level systems that experience even small levels of $T_1$ relaxation (either intrinsic, or due to the cavity mode used to generate collective interactions). As analyzed below, the $T_1$ relaxation both causes a degradation of the signal gain and causes the measurement signal to be overwhelmed by a large background contribution. This is true even if the single-spin cooperativity (see Eqn. 22) is larger than unity. Consequently, this approach to spin amplification cannot be used in many systems of interest, including almost all commonly studied solid-state sensing platforms.

The present embodiments include new spin amplification methods for an ensemble of N two-level systems that overcome the limitation posed by dissipation. Unlike previous work on interaction-based measurement, the present embodiments do not use collective unitary dynamics for amplification, but instead directly utilize collective dissipation as the key resource. We show that the collective decay of a spin ensemble coupled to a lossy bosonic mode gives rise to a signal gain G that exhibits the maximum possible scaling of $G \propto \sqrt{N}$. Crucially, in the presence of local dissipation, the amplification of the present embodiments depends only on the collective cooperativity (not on more restrictive conditions in terms of single-spin cooperativity) and this maximum gain can be reached even in regimes where the single-spin cooperativity is much smaller than unity. Moreover, the present embodiments introduce "added noise" that approaches the quantum limit one would expect for a bosonic phase-preserving linear amplifier. In addition, the scheme is compatible with standard dynamical decoupling techniques to mitigate inhomogeneous broadening. Our scheme has yet another surprising feature: in principle, it allows one to achieve an estimation error scaling like $1/\sqrt{N}$ even if one only performs a final readout on a small number of spins $N_A \ll N$. Finally, unlike existing unitary amplification protocols, which require the signal to be in a certain spin component [26,29], the present embodiments amplify any signal encoded in the transverse polarization of a spin ensemble (similar to phase-preserving amplification in bosonic systems [39]).

We stress that in contrast to the majority of interaction-based readout protocols, we are not aiming to use entangled states to reach the HL. Instead, our goal is to approach the SQL using conventional dissipative spin ensembles, in systems where extrinsic readout noise is extremely large compared to spin projection noise.

It is helpful to consider the present embodiments in a broader context. Our spin-amplification scheme represents a previously unexplored aspect of Dicke superradiance [40-43], a paradigmatic effect in quantum optics. Superradiance is the collective enhancement of the spontaneous emission of N indistinguishable spins interacting with a common radiation field. If the spins are initialized in the excited state, quantum interference effects will cause a short superradiant emission burst of amplitude $\propto N^2$ instead of simple exponential decay. In contrast to most work on superradiance, our focus is not on properties of the emitted radiation [40,44,45] or optical amplification [46,47], but rather on the "back-action" on the spin system itself. This back-action directly generates the amplification effect of the present embodiments. Somewhat surprisingly, we show that our superradiant amplification mechanism continues to be effective in the limit of dissipation-free unitary dynamics, where the collective physics is described by a standard Tavis-Cummings model.

We stress that the present embodiments are completely distinct from spin-amplification protocols in spintronics and nuclear magnetic resonance (NMR) systems: we are not aiming to measure the state of a single spin by copying it to a large ensemble [48] or a distant spin which can be read out more easily [49]. Instead, our goal is to amplify a signal that is already encoded in the entire spin ensemble. On the level of a semiclassical description, superradiance is similar to radiation damping in NMR systems [50], which has been proposed as a method to amplify and measure small magnetizations in NMR setups [51,52]. However, these protocols cannot be used in quantum metrology (where quantum noise is important) and they use a qualitatively and quantitatively distinct sensing scheme from the present embodiments.

II. Dissipative Gain Mechanism and Basic Sensing Protocol

FIG. 1A illustrates a method 100 for quantum spin amplification. The method 100 uses an ensemble of quantum spins that collectively form a single quantum state, such as a coherent spin state. All of the quantum spins in the ensemble have the same upper energy state (e.g., spin up) and lower energy state (e.g., spin down). As understood by those trained in the art, the dynamics of a two-level quantum system can be expressed in terms of spin. Thus, while the following description frequently uses the language of spin, it should be understood that the quantum spins may be, more generally, any type of two-level quantum system. This includes two energy levels of a multi-level quantum system (e.g., the two ground-state hyperfine levels of a rubidium atom). Examples of two-level quantum systems that can be used with the present embodiments include, but are not limited to, nuclear spins, electron spins, solid-state spins, atoms, ions, molecules, nitrogen vacancy defect centers, silicon vacancy defect centers, and superconducting qubits.

The top of FIG. 1A is a sequence of Bloch spheres that illustrates evolution of the ensemble in terms of a collective spin vector $\vec{S}$ that indicates polarization of the ensemble. The collective spin vector $\vec{S}$ can be decomposed into a longitudinal component that points along z and a transverse component that lies in the x-y plane. For clarity herein, the z axis is assumed to be the quantization axis. The longitudinal component indicates a longitudinal polarization of the ensemble that is oriented parallel to the quantization axis, i.e., the longitudinal polarization points either along the positive direction of the quantization direction or along the negative direction of the quantization axis. The transverse component indicates a transverse polarization of the ensemble that is oriented perpendicular to the quantization axis.

In a first Bloch sphere 102 of FIG. 1A, the method 100 starts with the ensemble of quantum spins in an initial spin state $\vec{S}_0$ pointing toward the south pole of the first Bloch sphere 102 (i.e., in the −z direction). Thus, all of the quantum spins start in the lower energy state. The ensemble is spin-polarized to transform the longitudinally-polarized initial spin state $\vec{S}_0$ into a transversely-polarized sensing spin state $\vec{S}_s$. In general, the sensing spin state $\vec{S}_s$ can be polarized along any direction in the x-y plane of the first Bloch sphere 102. In the case of FIG. 1A, a π/2 pulse rotates the initial spin state $\vec{S}_0$ by −π/2 about the y axis such that the sensing spin state $\vec{S}_s$ is polarized in the +x direction. Alternatively, the pulse can rotate the initial spin state $\vec{S}_0$ by +π/2 about the y axis such that the sensing spin state $\vec{S}_s$ is polarized in the −x direction. Alternatively, the initial spin state $\vec{S}_0$ can be rotated about the x axis such that the sensing spin state $\vec{S}_s$ is polarized along the y axis.

In other embodiments, the method 100 starts with the initial spin state $\vec{S}_0$ pointing toward the north pole of the first Bloch sphere 102 (i.e., in the +z direction). In this case, all of the quantum spins start in the upper energy state and a π/2 pulse can be applied to the ensemble to rotate the initial spin state $\vec{S}_0$ (e.g., about the x or y axis) into the transversely-polarized sensing spin state $\vec{S}_s$. In other embodiments, the method 100 starts with the sensing spin state $\vec{S}_s$, in which case there is no need to spin-polarize the ensemble.

In a second Bloch sphere 104 of FIG. 1A, the sensing spin state $\vec{S}_s$ precesses in the x-y plane. Upon accumulating a phase shift ϕ, the sensing spin state $\vec{S}_s$ is transformed into a phase-accumulated spin state $\vec{S}_{pa}$ that has first and second transverse polarization components that are orthogonal to each other. For example, in FIG. 1A the sensing spin state $\vec{S}_s$ is polarized only in the +x direction while the phase-accumulated spin state $\vec{S}_{pa}$ has a first transverse polarization component along x with a magnitude of S cos ϕ and a second transverse polarization component along y with a magnitude of S sin ϕ, where S=|$\vec{S}_{pa}$|=|$\vec{S}_s$|. Thus, in this case precession causes the phase-accumulated spin state $\vec{S}_{pa}$ to acquire a non-zero polarization component along y.

In a third Bloch sphere 106 of FIG. 1A, the phase-accumulated spin state $\vec{S}_{pa}$ is transformed into an intermediate spin state $\vec{S}_i$ by rotating the first transverse polarization component of the phase-accumulated spin state $\vec{S}_{pa}$ into a longitudinal polarization component of the intermediate spin state $\vec{S}_i$. The first transverse polarization component points in the +x direction and has a magnitude of $S_{pa}$ cos ϕ, where $S_{pa}$=|$\vec{S}_{pa}$|. This rotation does not affect the second transverse polarization component, which has a magnitude of $S_{pa}$ sin ϕ and is the same for both of the spin states $\vec{S}_{pa}$ and $\vec{S}_i$. In the example of FIG. 1A, the first transverse polarization component is rotated about the y axis by −π/2 to point toward the north pole of the third Bloch sphere 106. By pointing toward the north pole, the intermediate spin state $\vec{S}_i$ has a greater population in the upper energy state than in the lower energy state. As described below, this provides the energy for spin amplification in certain situations, such as spin amplification based on superradiant decay. In other situations, a different source can provide the energy for spin amplification, in which case first transverse polarization component can be rotated to alternatively point to the south pole.

In a fourth Bloch sphere 108, the ensemble of quantum spins is coupled to an auxiliary mode. In response to this coupling, the second transverse polarization component of the intermediate spin state $\vec{S}_i$ is amplified into an amplified transverse polarization of an amplified spin state $\vec{S}_a$. This amplified transverse polarization has a magnitude of $G(t)S_{pa}$ sin ϕ, where G(t) is a time-dependent gain factor (see Eqn. 2). The auxiliary mode may be, or approximate, a bosonic mode. In some embodiments, the auxiliary mode is a resonant mode of a photonic cavity, such as a microwave cavity, millimeter-wave cavity, or optical cavity (e.g., a Fabry-Perot cavity). In these embodiments, the coupling may be "turned on" by tuning a resonant frequency of the photonic cavity to match the energy spacing between the upper and lower energy states. Alternatively, an external magnetic or electric field can be applied to the ensemble to change the energy spacing such that it matches the resonant frequency of the photonic cavity. After the second transverse polarization component has been amplified, the coupling may then be "turned off". For example, the photonic cavity may be tuned such that none of its resonant modes are resonant with the transition between the upper and lower energy states. The auxiliary mode can alternatively be a phononic mode, such as a mechanical mode of a mechanical oscillator. Examples of such mechanical modes and oscillators are presented below in Section VIII.

Different physical mechanisms implement the amplification of the second transverse polarization component, depending on the nature of the coupling between the ensemble and the auxiliary mode. For example, consider when the auxiliary mode is a bosonic mode (e.g., a resonant mode of a photonic cavity). If the bosonic mode is sufficiently lossy or damped, then the coupling introduces collective decay (e.g., see the collective relaxation rate Γ in Eqn. 3 below). In response to this collective decay, the ensemble of quantum spins undergoes Dicke superradiance, a dissipative loss mechanism that causes the upward longitudinal polarization component to decay by emitting photons into the auxiliary mode. As the longitudinal polarization component loses energy and becomes shorter in length, the second transverse polarization component gains energy, thereby increasing in length.

The second transverse polarization component can still be amplified even when the auxiliary mode is not lossy. For example, when the auxiliary mode is a lossless bosonic mode of a photonic cavity, then the collective relaxation rate Γ is zero and the coupled quantum system (i.e., the coupled ensemble and photonic cavity) will undergo coherent evolution according to a unitary operator that is generated by a Hamiltonian that has no dissipation (see Eqn. 35). When the cavity is initially unexcited and the longitudinal polarization component of the intermediate spin state $\vec{S}_i$ points upward (i.e., toward the north pole of the Bloch sphere 108), then the intermediate spin state $\vec{S}_i$ will coherently evolve into the amplified spin state $\vec{S}_a$. At this point the coupling can be turned off to stop the coherent evolution of the amplified spin state $\vec{S}_a$. A similar amplified spin state can be obtained when the cavity is initially excited and the longitudinal polarization component of the intermediate spin state $\vec{S}_i$ points downward (i.e., toward the south pole of the Bloch sphere 108). In this case, the energy initially stored in the cavity is coupled out of the cavity and used for amplification. More details about amplification in lossless cavities is described below in Section VII and in Ref. [53].

The final step of the method 100 is to measure, or read out, the amplified transverse polarization of the amplified spin state $\vec{S}_a$. Read out can be performed in several ways. For example, the amplified transverse polarization can be measured with respect to a measurement axis that is transverse to the quantization axis (i.e., the measurement lies in the x-y plane of the Bloch sphere 110). Alternatively, the measurement axis can form an acute angle (and a supplementary oblique angle) with respect to the quantization axis. Another example of read out is shown in a fifth Bloch sphere 110 of FIG. 1A. Here, the amplified transverse amplified spin state $\vec{S}_a$ is rotated by $\pi/2$ about the x axis, thereby converting the amplified transverse polarization into an amplified longitudinal polarization. The amplified longitudinal polarization can then be measured along the quantization axis. While FIG. 1A shows the amplified longitudinal polarization pointing toward the north pole of the Bloch sphere 110, the amplified transverse polarization can alternatively point toward the south pole of the Bloch sphere 110.

As indicated in FIG. 1A, spin polarization of the initial spin state $\vec{S}_0$ into the sensing spin state $\vec{S}_s$, precession of the sensing spin state $\vec{S}_s$ into the phase-accumulated spin state $\vec{S}_{pa}$, and transformation of the phase-accumulated spin state $\vec{S}_{pa}$ into the intermediate spin state $\vec{S}_i$ collectively implement a Ramsey sequence in which the phase shift $\phi$ is the signal of interest. The present embodiments may therefore be used with any type of quantum sensing system that uses a Ramsey sequence. For example, when the upper and lower energy states are two non-degenerate energy eigenstates, the Ramsey sequence of FIG. 1A can be used to implement an atomic clock. Alternatively, an external electric or magnetic field can lift the degeneracy of the upper and lower energy states when these energy states are degenerate in the absence of such an external field. In this case, the phase shift $\phi$ is a measure of the field strength.

The bottom of FIG. 1A is an exemplary timing sequence that clarifies when signal acquisition, signal amplification, and readout occur. In the following description, we consider an ensemble of N two-level systems. As illustrated in the timing sequence of FIG. 1, the ensemble is in a fully polarized coherent spin state (CSS) at time $t_1$. The CSS then rotates by the angle $\phi$ (e.g., in response to an external field). At time $t_2$, the angle $\phi$ is encoded in the value of one component of the collective spin vector (here $\hat{S}_y$). We assume an infinitesimal signal, or phase shift, $\phi$ with $\langle \hat{S}_y \rangle$ depending linearly on $\phi$. We also set $t_2=0$ for convenience. The total error in the estimation of $\phi$ is then (see, e.g., [15,16]):

$$(\Delta\phi)^2 = (\Delta\phi)_{int}^2 + (\Delta\phi)_{det}^2 = \frac{(\Delta S_y)^2 + \Sigma_{det}^2}{|\partial_\phi \langle \hat{S}_y \rangle|^2}, \quad (1)$$

where $(\Delta S_y)^2 = \langle \hat{S}_y^2 \rangle - \langle \hat{S}_y \rangle^2$. The term $(\Delta\phi)_{int}^2$ in Eqn. 1 is the intrinsic spin-projection noise associated with the quantum state of the ensemble while the term $(\Delta\phi)_{det}^2$ describes added noise associated with imperfect readout of $\hat{S}_y$. This additional error can be expressed as an equivalent amount of $\hat{S}_y$ noise, $\Sigma_{det}^2$, that is referred back to $\phi$ using the transduction factor $|\partial_\phi \langle \hat{S}_y \rangle|$.

Consider first the generic situation where the detection noise completely dominates the intrinsic projection noise, $(\Delta\phi)_{det} \gg (\Delta\phi)_{int}$. This is the typical scenario in many solid-state systems, e.g. ensembles of NV defects in a diamond crystal whose state is read out using spin-dependent optical fluorescence [16]. The goal is to reduce $(\Delta\phi)_{det}$ without changing the final spin readout mechanism (i.e., $\Sigma_{det}^2$ remains unchanged). The only option available is "spin amplification", i.e., enhancement of the transduction factor that encodes the sensitivity of the ensemble to $\phi$. Specifically, before doing the final readout of $\hat{S}_y$, our goal is to implement dynamics that yields $$\partial_\phi \langle \hat{S}_y(t) \rangle = G(t) \langle \hat{S}_y(0) \rangle, \quad (2)$$

with a time-dependent gain factor G(t) that is larger than unity at the end of the amplification stage, i.e., $t=t_3$ in FIG. 1A. Achieving large gain will clearly reduce the total estimation error in the regime where measurement noise dominates: $\Delta\phi \to \Delta\phi/G(t_3)$. One might worry that in a more general situation, where the intrinsic projection noise is also important, this strategy is not useful, as one might end up amplifying the projection noise far more than the signal. We show in Section IV that this is not the case for our scheme: even if we use the optimal $t_3$ which maximizes the gain G(t), the amplified spin-projection noise referred back to $\phi$ (i.e., $(\Delta\phi)_{int}$ in Eqn. 1) is only approximately twice the value of this quantity in the initial state. This is reminiscent of the well-known quantum limit for phase-preserving amplification for bosonic systems [22,39] (for a detailed description, see Ref. [53]).

How can we implement amplification dynamics in as simple a way as possible? Any kind of amplifier inevitably requires an energy source. In some of the present embodiments, this is achieved by preparing the spin ensemble in an excited state. For concreteness, we assume that the ensemble has a free Hamiltonian $\hat{H}_0 = \omega \hat{S}_z$, where $\omega > 0$ and $\hbar = 1$. Hence, at the end of the signal acquisition step at $t = t_2 = 0$ (see FIG. 1A), we rotate the state such that its polarization is almost entirely in the +z direction (apart from the small rotation caused by the sensing parameter $\phi$), i.e., the ensemble is close to being in its maximally excited state. For the following dynamics, we consider simple relaxation of the ensemble towards the ground state of $\hat{H}_0$ (where the net polarization is in the −z direction). Consider now a situation where each spin is subject to independent, single-spin $T_1$ relaxation (at rate $\gamma_{rel}$) as well as a collective relaxation process (at rate $\Gamma$). In the rotating frame set by $\hat{H}_0$, the Lindblad master equation governing this dynamics is:

$$\frac{d\hat{\rho}}{dt} = \gamma_{rel}\sum_{j=1}^{N}\mathcal{D}[\hat{\sigma}_-^{(j)}]\hat{\rho} + \Gamma\mathcal{D}[\hat{S}_-]\hat{\rho}. \quad (3)$$

Here $\hat{S}_- = \sum_{j=1}^{N} \hat{\sigma}_-^{(j)}$ is the collective spin-lowering operator, $\hat{\sigma}_-^{(j)} = (\hat{\sigma}_x^{(j)} - i\hat{\sigma}_y^{(j)})/2$ is the lowering operator of spin j, $\hat{\sigma}_{x,y,z}^{(j)}$ are the Pauli operators acting on spin j, and $\mathcal{D}[\hat{O}]\hat{\rho} = \hat{O}\hat{\rho}\hat{O}^\dagger - \{\hat{O}^\dagger\hat{O}, \hat{\rho}\}/2$ is the standard Lindblad dissipation superoperator.

At first glance, it is hard to imagine that such a simple relaxational dynamics will result in anything interesting. Surprisingly, this is not the case. It is straightforward to derive equations of motion that govern the expectation values of $\hat{S}_x$ and $\hat{S}_y$:

$$\frac{d\langle\hat{S}_{x,y}\rangle}{dt} = \frac{\Gamma}{2}\langle\{\hat{S}_z, \hat{S}_{x,y}\}\rangle - \hat{S}_{x,y}\rangle - \frac{\gamma_{rel}}{2}\langle\hat{S}_{x,y}\rangle. \quad (4)$$

Not surprisingly, we see that single-spin relaxation is indeed boring: it simply causes any initial transverse polarization to decay with time. However, the same is not true for the collective dissipation. Within a standard mean-field approximation, the first term on the right-hand side of Eqn. 4 suggests that there will be exponential growth of both $\langle\hat{S}_x\rangle$ and $\langle\hat{S}_y\rangle$ at short times if the condition $\langle\hat{S}_z\rangle > \frac{1}{2}$ holds, i.e., if the spins have a net excitation. This is the amplification mechanism that is the basis of the present embodiments, and that we maximize with our chosen initial condition.

The resulting picture is that with collective decay, the relaxation of the ensemble polarization towards the south pole is accompanied (for intermediate times at least) by a growth of the initial values of $\langle\hat{S}_{x,y}\rangle$. This "phase-preserving" (i.e., isotropic in the $S_x$–$S_y$ plane) amplification mechanism will generate a gain $G(t) \geq 1$ that enhances the subsequent measurement. Numerically-exact simulations show that this general picture is correct (see FIG. 1B), with the maximum amplification gain G(t) occurring at a time $t=t_{max}$ that approximately coincides with the average polarization vector crossing the equator of the Bloch sphere. We stress that the collective nature of the relaxation is crucial: independent $T_1$ decay yields no amplification when each quantum spin has only two energy states. At a heuristic level, the collective dissipator in Eqn. 4 mediates dissipative interactions between different spins, and these interactions are crucial to have gain.

Figure 1B:
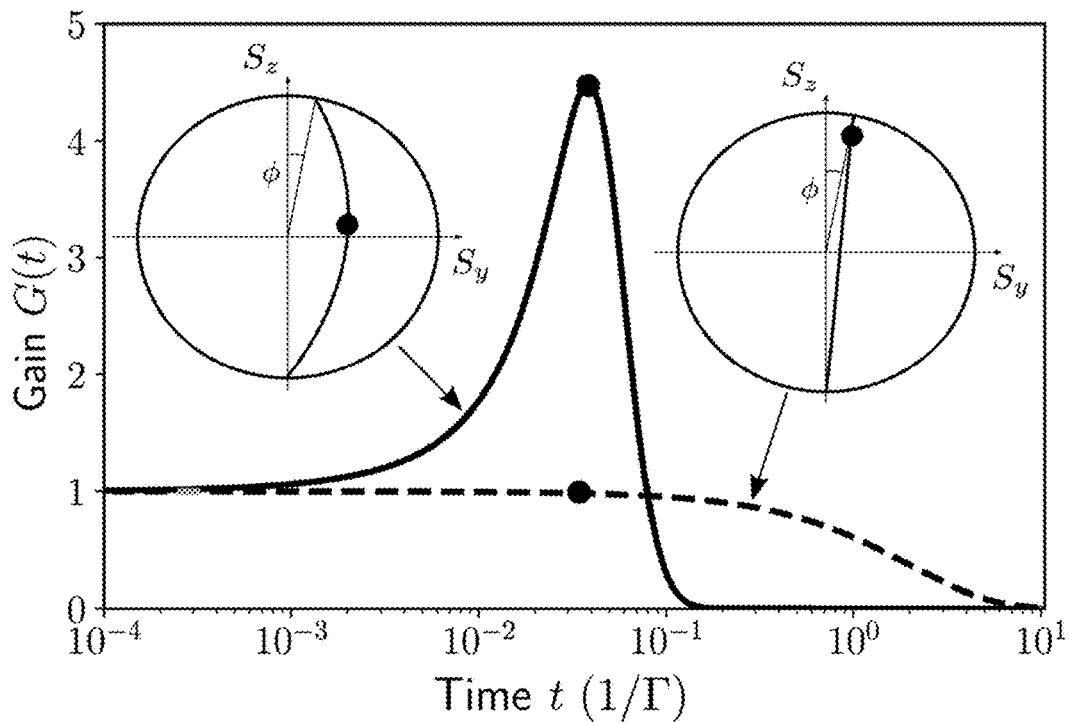
FIG. 1B is a plot of time-dependent gain factor as a function of time for collective decay and single-spin decay.

FIG. 1B is a plot of the time-dependent gain factor G(t) (see Eqn. 10) for collective decay (solid curve, numerically exact solution of $d\hat{\rho}/dt=\Gamma\mathcal{D}[\hat{S}_-]\hat{\rho}$) and single-spin decay (dashed curve, $d\hat{\rho}/dt=\Gamma\Sigma_{j=1}^N \mathcal{D}[\hat{\sigma}_-^{(j)}]\hat{\rho}$). Collective decay leads to transient amplification (i.e., G(t)>1) while single-spin decay does not. To generate the plot of FIG. 1B, we used N=120 spins and an initial coherent spin state in the y-z plane, as shown in the third Bloch sphere 106 of FIG. 1A with $\phi=10^{-5}$. The insets of FIG. 1B show sketches of the corresponding trajectories of the spin vector, where the angle $\phi$ is exaggerated for readability.

Figure 1C:
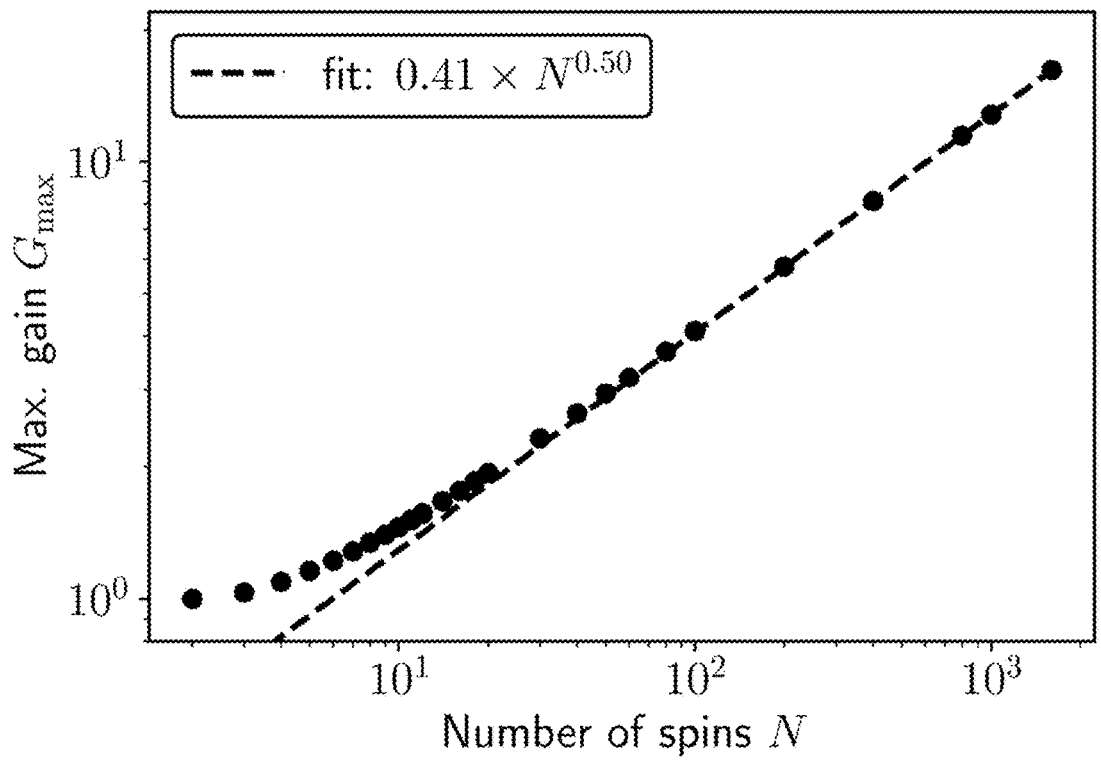
FIG. 1C is a plot of maximum gain as a function of the number of spins.

FIG. 1C is a plot of maximum gain $G_{max}$ as a function of the number of spins N. In FIG. 1C, the black circles were obtained by full numerical solution of the Eqn. 3 for $\gamma_{rel}/\Gamma=0$. The dashed line indicates a fit for large N.

We thus have outlined our basic amplification procedure: prepare a CSS close to the north pole of the generalized Bloch sphere (with $\phi$ encoded in the small $\hat{S}_x$ and $\hat{S}_y$ components of the polarization), then turn on collective relaxation. Stopping the relaxation at time $t=t_{max}$ results in the desired amplification of information on $\phi$ in the average spin polarization; this can be then read out as is standard by converting transverse polarization into population differences via a $\pi/2$ rotation, as shown in FIG. 1A. We stress that the generic ingredients needed here are the same as those needed to realize OAT spin squeezing and amplification protocols: a Tavis-Cummings model where the spin ensemble couples to a single, common bosonic mode (a photonic cavity mode [54-56], or even a mechanical mode [57-60]) and time-dependent control over the strength of the collective interaction [37,61]. In previously-proposed OAT protocols, cavity loss limits the effectiveness of the scheme, and one thus works with a large cavity-ensemble detuning to minimize its impact. In contrast, our scheme utilizes the cavity decay as a key resource, allowing one to operate with a resonant cavity-ensemble coupling. In such an implementation, the ability to control the detuning between the cavity and the spin ensemble provides a means to turn on and off the collective decay $\Gamma$. This general setup is analyzed in more detail in Section VII and an analysis of the timing errors is given in Ref. [53]. Alternatively, one can achieve time-dependent control over the collective decay rate by driving Raman transitions in a $\Lambda$-type three-level system [62].

Before proceeding to a more quantitative analysis, we pause to note that, for short times and $\gamma_{rel}=0$, one can directly connect the superradiant spin-amplification physics here to simple phase-preserving bosonic linear amplification. Given our initial state, it is convenient to represent the ensemble using a Holstein-Primakoff bosonic mode $\hat{a}$ via $\hat{S}_z=N/2-\hat{a}^\dagger\hat{a}$. For short times, one can linearize the transformation for $\hat{S}_x$ and $\hat{S}_y$, with the result that these are just proportional to the quadratures of $\hat{a}$. The same linearization turns the collective decay in Eqn. 3 into simple bosonic anti-damping: $d\hat{\rho}/dt \sim \Gamma N \mathcal{D}[\hat{a}^\dagger]\hat{\rho}$. This dynamics causes exponential growth of $\langle\hat{a}\rangle$, and describes phase-preserving amplification of a non-degenerate parametric amplifier in the limit where the idler mode can be adiabatically eliminated [39]. While this linearized picture provides intuition into the origin of gain, it is not sufficient to fully understand our system: the nonlinearity of the spin system is crucial in determining the non-monotonic behavior of G(t) shown in FIG. 1B, and in determining the maximum gain. We explore this more in what follows.

Finally, we note that Eqn. 3 (with $\gamma_{rel}=0$) has previously been studied as a spin-only, Markovian description of superradiance, i.e., the collective decay of a collection of two-level atoms coupled to a common radiation field [44,63]. The vast majority of studies of superradiance focus on the properties of the radiation emitted by an initially excited collection of atoms. We stress that our focus here is different. We have no interest in this emission and will not assume any access to the reservoir responsible for the collective spin dissipation. Instead, we use the effective superradiant decay generated by Eqn. 3 only as a tool to induce nonlinear collective spin dynamics, which can then be used for amplification and quantum metrology.

In the previous description, it was assumed that each of the N quantum spins of the ensemble is a two-level quantum system. This is equivalent to each quantum spin having a spin quantum number of $\frac{1}{2}$. Accordingly, the ensemble in this case is referred to as a spin-$\frac{1}{2}$ ensemble. However, the present embodiments can still be used when each of the N quantum spins is a multi-level quantum system having more than two energy levels. This is equivalent to each quantum spin having a spin quantum number greater than $\frac{1}{2}$ (e.g., 1, 3/2, 2, 5/2, etc.). Accordingly, the ensemble in this case is referred to as a spin>$\frac{1}{2}$ ensemble (e.g., a spin-1 ensemble, a spin-3/2 ensemble, a spin-2 ensemble, etc.). In a spin>$\frac{1}{2}$ ensemble, two of the three or more energy levels can be identified as the upper and lower energy states. The remaining one or more energy levels may have energies greater than that of the lower energy state. Similarly, the remaining one or more energy levels may have energies less than that of the upper energy state.

A person skilled in the art will understand how to use the present embodiments with a spin>$\frac{1}{2}$ ensemble. For example, experimental implementations of coherent control of the ensemble (e.g., $\pi/2$ rotations) may need to be modified accordingly. Nevertheless, the description of longitudinal and transverse polarizations presented above still applies.

Similarly, the physical mechanisms described that give rise to the amplified spin state (i.e., coherent evolution according to a unitary operator and superradiance induced by collective decay) also still apply. This includes not just experimental implementations but also appropriate modifications to the numerically studies presented herein.

As an example of how the present embodiments can be used with a spin>½ ensemble, consider magnetometry performed with a ground-state hyperfine level of an alkali metal (e.g., the F=1 or F=2 ground-state hyperfine levels of $^{87}$Rb, the F=3 or F=4 ground-state hyperfine levels of $^{122}$Cs, the F=7/2 or F=9/2 ground-state hyperfine levels of $^{40}$K, etc.). Magnetometry is typically implemented with a pair of neighboring magnetic sublevels (i.e., magnetic sublevels for which $\Delta m_F = \pm 1$), which is equivalent to a spin-½ system. Such neighboring magnetic sublevels can be coherently controlled (e.g., $\pi/2$ pulses) using a single-frequency microwave pulse. However, a pair of neighboring magnetic sublevels does not provide the greatest sensitivity to an external magnetic field. Rather, the two stretch states, with magnetic quantum numbers $m_F = \pm F$ provides the greatest sensitivity. However, for spin>½, the two stretch states cannot be coupled with a single-frequency electromagnetic field. Instead, a multi-frequency pulse (or several single-frequency pulses applied simultaneously) must be used to create a superposition state (i.e., transversely polarize the ensemble). Superradiant decay, when used as the physical mechanism for amplification, leaves some of the atoms populated in intermediate magnetic sublevels between the two stretch states. Thus, the step of transforming described above with respect to the fifth Bloch sphere 110 may need to be experimentally modified to account for the non-zero populations of these intermediate magnetic sublevel. Nevertheless, spin amplification can be achieved and used to increase sensitivity just like for the spin-½ case.

III. Mean-Field Theory Description of Superradiant Amplification

To gain a more quantitative understanding of our nonlinear amplification process, we analyze the dynamics of Eqn. 3 with $\gamma_{ref}=0$ using a standard mean-field theory (MFT) decoupling. This analysis goes beyond a linearized bosonic theory obtained from a Holstein-Primakoff transformation and is able to capture aspects of the intrinsic nonlinearity of the spin dynamics. We start by using MFT to understand the gain dynamics, which can be determined by considering the evolution of the mean values of the collective spin operator; fluctuations and added-noise physics are considered in Section IV below. Note that a simpler approach based on semiclassical equations of motion fails to capture the amplification dynamics correctly, i.e., superradiant amplification is a genuinely quantum effect and quantum fluctuations need to be taken into account (see Ref. [53] and Section F below).

The MFT equation of motion for $S_z \equiv \langle \hat{S}_z \rangle$ in the large-N limit is $$\frac{dS_z}{dt} = -\Gamma \frac{N^2}{4} - \Gamma S_z(1-S_z), \quad (5)$$

where the constant term is obtained by using the fact that the dynamics conserve $\vec{S}^2$. Starting from a highly polarized initial state with $S_z(0) = N \cos(\phi)/2$, this equation describes the well-known nonlinear superradiant decay of the $S_z$ component to the steady state $|\downarrow\rangle^{\otimes N}$ [45]. The corresponding equations of motion for average values $S_x$ and $S_y$ correspond to the expected decoupling of Eqn. 4:

$$\frac{dS_{x,y}}{dt} = \Gamma\left(S_z - \frac{1}{2}\right)S_{x,y} \equiv \lambda(t) S_{x,y}, \quad (6)$$

where we have introduced the instantaneous gain rate $\lambda(t)$. For $\lambda(t)>0$ ($\lambda(t)<0$), any initial polarization component of the collective average Bloch vector in the x-y plane will be amplified (damped). Without loss of generality, we chose the initial transverse polarization to be entirely in the y direction. Thus, the $S_x$ component will always remain zero since the initial state has $S_x(0)=0$. In contrast, the highly polarized initial state $S_z(0) \approx N/2 \gg 1/2$ leads to amplification of the nonzero initial value $S_y(0) = N \sin(0)/2$ at short times. Eventually, the superradiant decay evolves $S_z(t)$ to its steady-state value $S_z(t \to \infty) = -N/2$. As a consequence, for sufficiently long times, the time-dependent gain rate $\lambda(t)$ will be reduced and amplification ultimately turns into damping if $S_z(t)<1/2$. The MFT equation of motion (i.e., Eqn. 6) predicts that maximum amplification of $S_y$ is achieved at the time $t_{max}$ where $S_z(t_{max})=1/2$, which is clearly beyond the regime of applicability of a linearized theory based on the Holstein-Primakoff transformation. In the large-N limit, the MFT result for $t_{max}$ takes the form $$t_{max} = \frac{\ln N}{\Gamma N}, \quad (7)$$

which is the well-known delay time of the superradiant emission peak [45]. The short transient period where $\lambda(t)>0$ is enough to yield significant amplification:

$$S_{x,y}(t) = S_{x,y}(0) e^{\int_0^t dt' \lambda(t')} \quad (8)$$

$$= S_{x,y}(0) \frac{e^{\Gamma t/2} \cosh\left(\frac{1}{2}\ln N\right)}{\cosh\left(\frac{N}{2}\Gamma t - \frac{1}{2}\ln N\right)}.$$

Evaluating this at $t=t_{max}$ given by Eqn. 7 yields the following MFT result for the maximum value of $S_{x,y}$:

$$S_{x,y}(t_{max}) = \frac{\sqrt{N}}{2} S_{x,y}(0). \quad (9)$$

Note that the signal gain increases with increasing N while the waiting time $t_{max}$ required to reach the maximum gain decreases, giving rise to fast amplification. Importantly, the optimal amplification time $t_{max}$ given in Eqn. 7 is independent of the tilt angle $\phi$ in the metrologically relevant limit of $\phi \ll 1$. Therefore, the gain G(t) is independent of the signal $\phi$. The breakdown of this relation defines the dynamic range of the spin amplifier and is analyzed in the Ref. [53].

We now verify this intuitive picture derived from MFT using numerically-exact solutions of Eqn. 3. To analyze the solutions, we define the time-dependent signal gain G(t) as follows:

$$G(t) = \lim_{\phi \to 0} \frac{\langle \hat{S}_y(t) \rangle}{\langle \hat{S}_y(0) \rangle} \quad (10)$$

$$G_{max} = \max_{t \geq 0} G(t) = G(t_{max}),$$

where $t_{max}$ is determined numerically. Note that this is identical to the definition given in Eqn. 2, as G(t) is independent of $\phi$ for $\phi \ll 1$. Combining Eqns. 9 and 10, we thus expect a scaling $G_{max} \propto \sqrt{N}$ based on MFT. Numerically-exact master equation simulations shown in FIGS. 1C, 2A, and 2B confirm that (up to numerical prefactors) the scaling of $G_{max}$ and $t_{max}$ predicted by MFT are correct in the large-N limit.

Figure 2A:
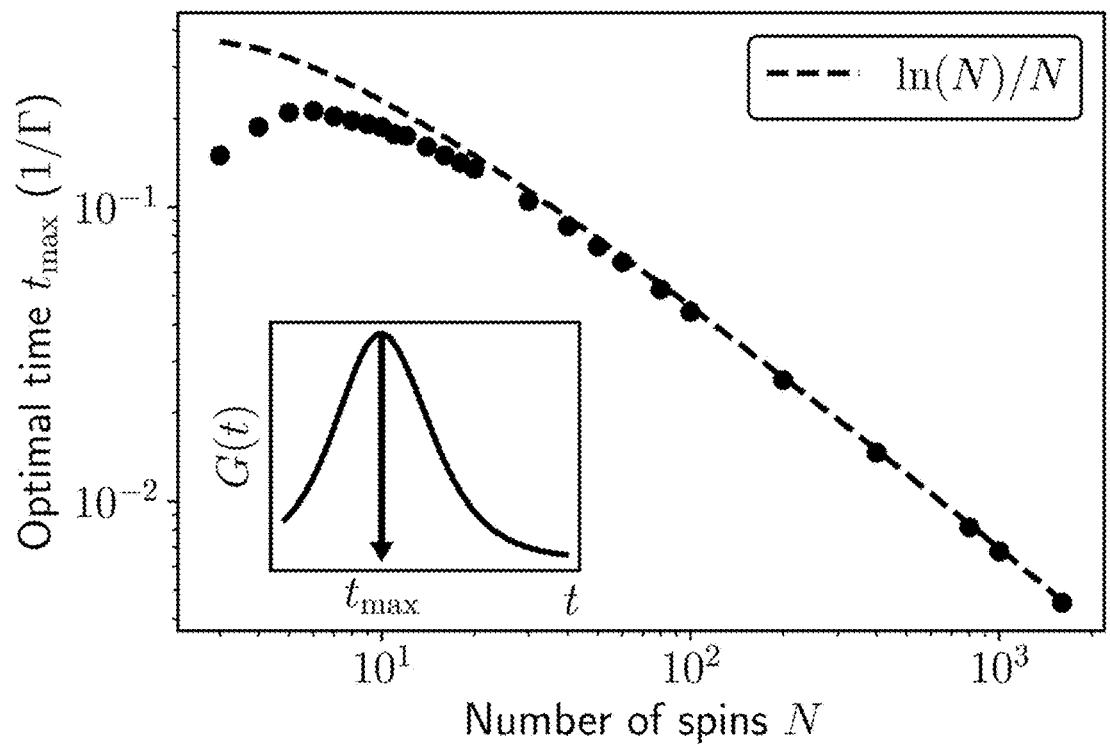
FIG. 2A is a plot of the optimal time as a function of the number of spins.
Figure 2B:
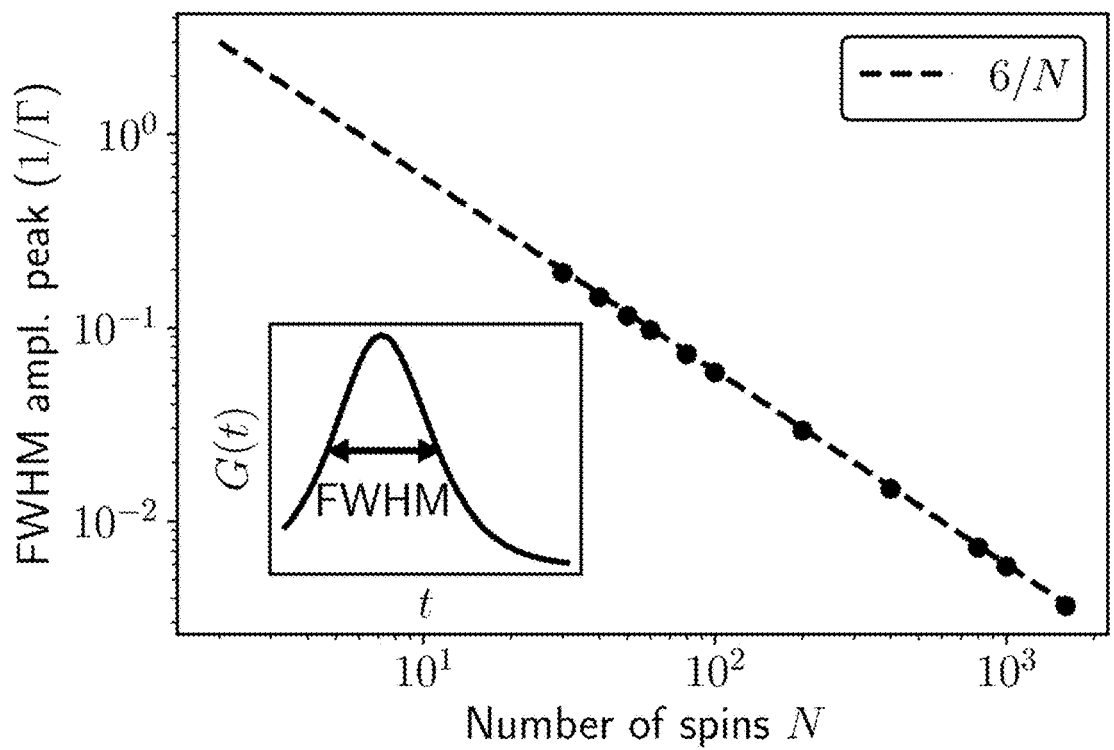
FIG. 2B is a plot of the full width at half maximum of the time-dependent gain as a function of the number of spins.

FIG. 2A is a plot of the optimal time $t_{max}$ as a function of the number of spins N. The optimal time $t_{max}$ is the time which maximizes the time-dependent gain G(t) defined in Eqn. 10. FIG. 2B is a plot of full-width-at-half-maximum (FWHM) of the time-dependent gain G(t) as a function of the number of spins N In both FIGS. 2A and 2B, the black circles were obtained by a numerically exact solution of the collective relaxation dynamics generated by the master equation (i.e., Eqn. 3 for $\gamma_{rel}/\Gamma=0$. The dashed lines indicate fits of the large-N results based on the scaling laws derived using mean-field theory, It is also interesting to note that on general grounds, $G_{max} \propto \sqrt{N}$ is the maximal gain scaling that we expect to be possible. This follows from the fact that we would expect initial fluctuations of $\hat{S}_x$ and $\hat{S}_y$ to be amplified (at least) the same way as the average values of these quantities, and hence expect $(\Delta S_x)^2 \geq G_{max}^2 N/4$, where N/4 represents the initial fluctuations of $\hat{S}_x$ in the initial CSS. Next, note that because of the finite dimensional Hilbert space, $(\Delta S_x)^2$ cannot be arbitrarily large and is bounded by $N^2/4$. This immediately tells us that $G_{max}$ cannot grow with N faster than $\sqrt{N}$. The gain scaling can also be understood heuristically by using the fact that there is only instantaneous gain for a time $t < t_{max} = \ln(N)/N\Gamma$, and that, during this time period, the instantaneous gain rate is $\lambda(t) \approx N\Gamma/2$. Exponentiating the product of this rate and $t_{max}$ again yields a $\sqrt{N}$ scaling.

IV. Improving Sensitivity and Approaching the SQL With Extremely Bad Measurements We now discuss how the amplification dynamics can improve the total estimation error ($\Delta\phi$) introduced in Eqn. 1. For concreteness, we focus on the general situation where the readout mechanism involves adding independent contributions from each spin in the ensemble, and hence the noise associated with the readout itself scales as N:

$$\Sigma_{det}^2 \equiv \Xi_{det}^2 \frac{N}{4}, \tag{11}$$

with $\Xi_{det}$ an N-independent constant. Note that the factor of ¼ in the definition is convenient, as $\Xi_{det}^2$ directly describes the ratio of readout noise to the intrinsic projection noise. Equation 11 describes the scaling of readout noise in many practically relevant situations, including standard spin-dependent-fluorescence readout of solid-state spin ensembles [16] and of trapped ions [64]. In this case and for $\phi \ll 1$, one has $$\Xi_{det}^2 = \frac{1}{\tilde{C}^2 n_{avg}}, \tag{12}$$

where $\tilde{C}$ is the fluorescence contrast of the two spin states and $n_{avg}$ is the average number of detected photons per spin in a single run of the protocol.

In considering the estimation error, we will also now account for the fact that our amplification mechanism will not only cause $\langle \hat{S}_y \rangle$ to grow, but also cause the variance $(\Delta S_y)^2$ to grow over its initial CSS value of N/4. The best case is that the variance is amplified exactly the same way as the signal, but in general there will be excess fluctuations beyond this. This motivates the definition of the added noise of our amplification scheme (similar to the definition of the added noise $\sigma_{add}$ of a linear amplifier). Letting $(\Delta\hat{S}_y)^2|_{amp}$ denote the variance of $\hat{S}_y$ in the final, post-amplification state of the spin ensemble after an optimal amplification time, we write:

$$(\Delta S_y)^2|_{amp} \equiv G_{max}^2 \frac{N}{4}(1 + \sigma_{add}^2). \tag{13}$$

We have normalized $\sigma_{add}$ to the value of the CSS variance; hence, $\sigma_{add}^2=1$ corresponds to effectively doubling the initial fluctuations (once the gain has been included).

For linear bosonic phase-preserving amplifiers, it is well known that the added noise of a phase-preserving amplifier is at best the size of the vacuum noise [22,39,65]. At a fundamental level, this can be attributed to the dynamics amplifying both quadratures of the input signal, quantities that are described by non-commuting operators. One might expect a similar constraint here, as our spin amplifier also amplifies two non-commuting quantities (namely $\hat{S}_x$ and $\hat{S}_y$). Hence, one might expect that the best we can achieve in our spin amplifier is to have the added noise satisfy $\sigma_{add}^2=1$. A heuristic argument that parallels Caves' classic calculation [22] suggests one indeed has the constraint $\sigma_{add}^2 \geq 1-1/G^2$ (T)N (see Ref [53]). For our system, full master equation simulations let us investigate how the added noise behaves for large N and maximum amplification. Remarkably, we find $\sigma_{add}^2 \approx 1.3$ in the large-N limit, which is just slightly above the expected level based on the heuristic argument (see FIG. 3B). This leads to a crucial conclusion: our amplification scheme is useful even if one cares about approaching the SQL.

Note that the amplified fluctuations in Eqn. 13 can at most be $N^2/4$ due to the finite dimensionality of the Hilbert space. Using the numerical result $G_{max}=c_0\sqrt{N}$ where $c_0 \approx 0.42$ (see FIG. 1C), one can derive an upper bound on the added noise:

$$\sigma_{add}^2 \leq \frac{1}{c_0^2} - 1 \approx 4.7. \tag{14}$$

With the above definitions in hand, we can finally quantify the estimation error in Eqn. 1 of our amplification-assisted measurement protocol. Combining Eqns. 2, 11, and 13, one finds that the general expression applied to our scheme reduces to $$(\Delta\phi)^2 = \frac{1}{N}\left[1 + \sigma_{add}^2 + \frac{\Xi_{det}^2}{G_{max}^2}\right] \tag{15}$$

$$= \frac{1}{N}\left[1 + \sigma_{add}^2 + \frac{\Xi_{det}^2/c_0^2}{N}\right],$$

where we have used the large-N scaling of the maximum gain in the last equation: $G_{max}=c_0\sqrt{N}$ with $c_0 \approx 0.42$.

There are two crucial things to note here: First, if readout noise completely dominates (despite the amplification), our amplification approach changes the scaling of the estimation error ($\Delta\phi$) with the number of spins from $1/\sqrt{N}$ to $1/N$. While this scaling is reminiscent of Heisenberg-limited scaling, there is no connection: in our case, this rapid scaling with N only holds if one is far from the SQL. Nonetheless, this shows the potential of amplification to dramatically increase sensitivity in this readout-limited regime.

Second, for $N \gg \Xi_{det}^2$, the amplification protocol will make the added measurement noise negligible compared to the fundamental noise of the quantum state. In this limit, the total estimation error almost reaches the SQL: it scales as $(\Delta\phi) \propto ((1+\sigma_{add}^2)/N)^{1/2} \approx \sqrt{2.3/N}$. This is only off by a numerical prefactor $\sqrt{2.3}$ from the exact SQL. We thus have established another key feature of our scheme: using amplification and a large enough ensemble, one can in principle approach the SQL within a factor of two regardless of how bad the spin readout is. For a fixed detector noise $\Xi_{det}$, the crossover in the estimation error $(\Delta\phi)$ from a 1/N scaling to a $1/\sqrt{N}$ scaling is illustrated in FIG. 3A.

Figure 3A:
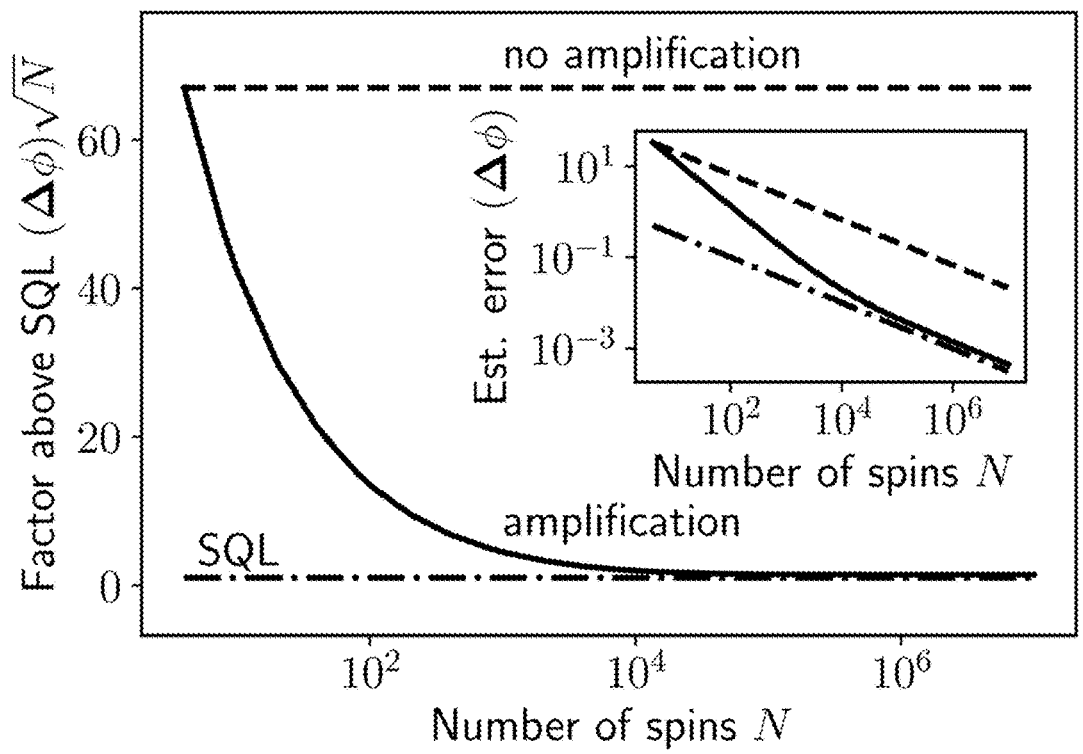
FIG. 3A illustrates the suppression of detection noise by amplification.

FIG. 3A illustrates suppression of detection noise by amplification. The best reported fluorescence readout of an NV ensemble is a factor of $\Xi_{det} = (\tilde{C}^2 n_{avg})^{-1/2} = 67$ above the SQL [16]. We assume the ideal case where this factor is independent of the ensemble size (dashed line). Amplification suppresses the readout noise (solid line) and allows one to approach the SQL (dash-dotted line). The inset shows the scaling of the total estimation error $(\Delta\phi)$ with and without amplification (solid and dashed lines, respectively), and the SQL (dash-dotted line). The curves have been obtained using a MFT analysis of Eqn. 3 for $\gamma_{rel}/\Gamma = 0$ and agree qualitatively with numerically exact solutions of the master equation (i.e., Eqn. 3), which have been used to calculate the added noise $\sigma_{add}^2$ of FIG. 3B (defined in Eqn. 15) for $\gamma_{rel}/\Gamma = 0$.

Figure 3B:
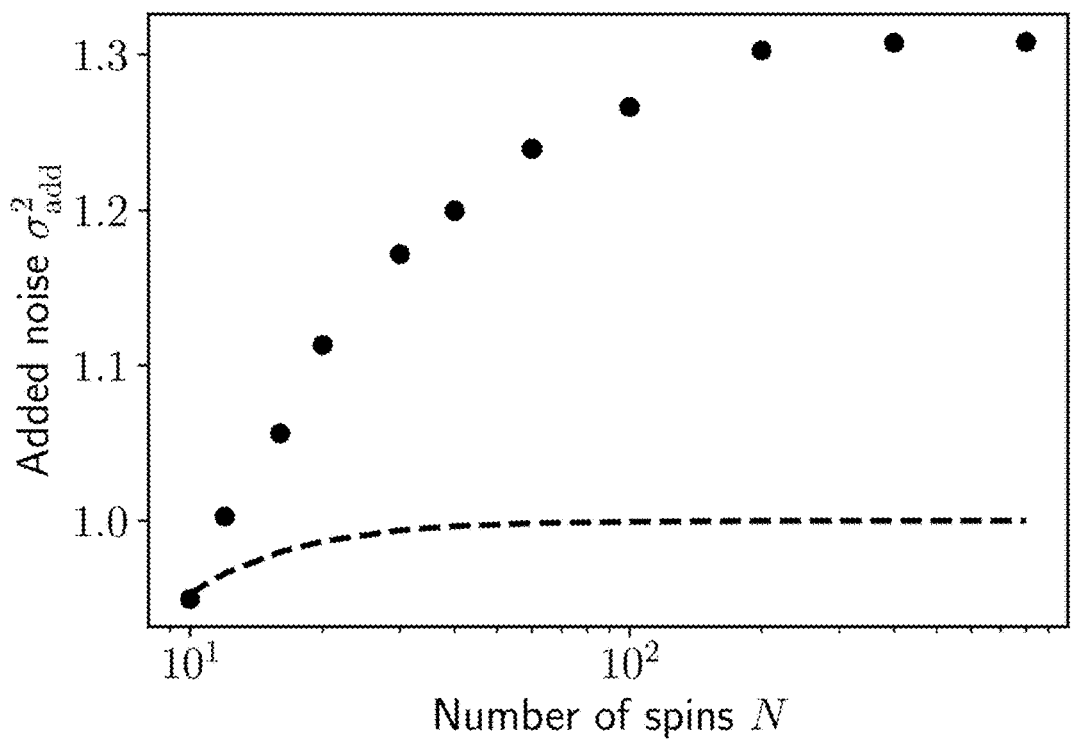
FIG. 3B is a plot of added noise as a function of the number of spins.

FIG. 3B is a plot of the added noise $\sigma_{add}^2$ as a function of the number of spins N for $\gamma_{rel}/\Gamma = 0$. The dash-dotted line is the expected minimum amount of added noise, $1 - 1/G_{max}^2 N$, based on a heuristic argument detailed in Ref [53]. Note that this is not a strict lower bound.

V. Enhanced Sensitivity Despite Reading Out a Small Number of Spins

There are many practical situations where, even though the signal of interest $\phi$ influences all N spins in the ensemble, one can only read out the state of a small subensemble A with $N_A \ll N$ spins. For example, for fluorescence readout of an NV spin ensemble, the spot size of the laser could be much smaller than the spatial extent of the entire ensemble. For a standard Ramsey scheme (i.e., no superradiant amplification), there are no correlations between spins, and the unmeasured $N-N_A$ spins do not help in improving the measurement. In the best case, the estimation error then scales as $\Delta\phi \propto 1/\sqrt{N_A}$. Surprisingly, the situation is radically different if we first implement superradiant amplification on the full ensemble before reading out the state of the small subensemble. In this case, we are able to achieve an SQL-like scaling $\Delta\phi \propto 1/\sqrt{N}$ even though one measures only $N_A \ll N$ spins. This dramatically improved scaling reflects the fact that the superradiant amplification involves a dissipative interaction between all the spins, hence the final state of the small subensemble is sensitive to the total number of spins N.

To analyze this few-spin readout scenario, we partition the N spins into two subensembles A and B of size $N_A$ and $N_B \equiv N - N_A$, respectively. Without loss of generality, we enumerate the spins starting with subensemble A, which allows us to define the subensemble operators $\hat{S}_k^A = \Sigma_{j=1}^{N_A} \hat{\sigma}_k^{(j)}/2$ and $\hat{S}_k^B = \Sigma_{j=N_A+1}^{N} \hat{\sigma}_k^{(j)}/2$, where $k \in \{x, y, z\}$. Their sum is the spin operator of the full ensemble, $\hat{S}_k = \hat{S}_k^A + \hat{S}_k^B$. We now consider a scheme where only the spin state of the A ensemble is measured at the very end of the amplification protocol shown in FIG. 1. The statistics of this measurement are controlled by the operator $\hat{S}_y^A$, with the signal encoded in its average value. Note that our ideal amplification dynamics always results in a spin state that is fully permutation-symmetric (i.e., at any instant in time, the average value of single spin operators are identical for all spins). It thus follows immediately that the subensemble gain is identical to the gain associated with the full ensemble:

$$\langle \hat{S}_y^A(t_{max}) \rangle = G_{max} \langle \hat{S}_y^A(0) \rangle = G_{max} \frac{N_A}{2} \phi, \quad (16)$$

with $G_{max} = c_0 \sqrt{N}$ in the large-N limit (and $c_0 \approx 0.42$). We stress that the gain is determined by the size of the full ensemble even though we are only measuring $N_A \ll N$ spins, which can be seen by inspecting the equations of motion for the transverse components $\hat{\sigma}_{x,y}^{(k)}$ of an arbitrary spin k:

$$\frac{d\langle \hat{\sigma}_{x,y}^{(k)} \rangle}{dt} = \frac{\Gamma}{2} \langle \{\hat{S}_{x,y}, \hat{\sigma}_z^{(k)}\} \rangle - \frac{\Gamma}{2} \langle \hat{\sigma}_{x,y}^{(k)} \rangle. \quad (17)$$

The y component of each individual spin is driven by a collective spin operator $\hat{S}_y$ whose expectation value is proportional to the ensemble size $\langle \hat{S}_y \rangle = N\phi/2$.

Next, consider the fluctuations in $\hat{S}_y^A$. The variance of this operator must be less than $N_A^2/4$ in any state; we thus parameterize these fluctuations by $(\Delta S_y^A)^2(t_{max}) = q N_A^2/4$ where $q \leq 1$. If we now only consider the fundamental spin projection noise (i.e., ignore any additional readout noise), we can combine these results to write the estimation error in $\phi$ as:

$$(\Delta\phi)_{int}^2 = \frac{(\Delta S_y^A)^2(t_{max})}{|\partial_\phi \langle \hat{S}_y^A(t_{max}) \rangle|^2} = \frac{q}{G_{max}^2} = \frac{q/c_0^2}{N} \leq \frac{1/c_0^2}{N} \quad (18)$$

We thus have a crucial result: even in the worst-case scenario q=1, for large N, our estimation error scales as 1/N despite measuring $N_A \ll N$ spins.

We can use a similar analysis to consider the contribution of detection noise to the estimation error in our subensemble readout scheme. We again assume (as is appropriate for fluorescence readout) that the detector noise scales with the number spins that are read out, i.e., $\Sigma_{det,A}^2 = \Xi_{det}^2 N_A/4$. We thus obtain the detection-noise contribution to the estimation error:

$$(\Delta\phi)_{det}^2 = \frac{\Sigma_{det,A}^2}{|\partial_\phi \langle \hat{S}_y^A(t_{max}) \rangle|^2} = \frac{\Xi_{det}^2}{G_{max}^2 N_A} = \frac{\Xi_{det}^2/c_0^2}{N_A N}, \quad (19)$$

i.e., the detection noise is again suppressed by a factor of N, the size of the full ensemble.

Combining these results, we find $$(\Delta\phi) = \frac{1}{c_0 \sqrt{N}} \sqrt{q + \frac{\Xi_{det}^2}{N_A}} \leq \frac{1}{c_0 \sqrt{N}} \sqrt{1 + \frac{\Xi_{det}^2}{N_A}}, \quad (20)$$

where $c_0 \approx 0.4$ in the large-N limit. We thus find that, in the case where $N_A$ is held fixed while N is increased, our superradiant amplification scheme yields a measurement sensitivity that scales as $(\Delta\phi) \propto 1/\sqrt{N}$. Surprisingly, it is controlled by the full size of the ensemble, and not controlled by the much smaller number of spins that are actually measured, $N_A$. We illustrate this in FIGS. 4A and 4B for the extreme case of readout of a single spin, $N_A=1$, and for the case of readout of a small fraction of the spin ensemble, $N_A=0.01N$. While the analysis above (like the analysis throughout this paper) is done in the limit of an infinitesimally small signal $\phi$, the analysis is still applicable for a finite, non-zero value of $\phi$ as long as the dynamic range of the amplification has not been saturated (see Ref [53]).

Figure 4A:
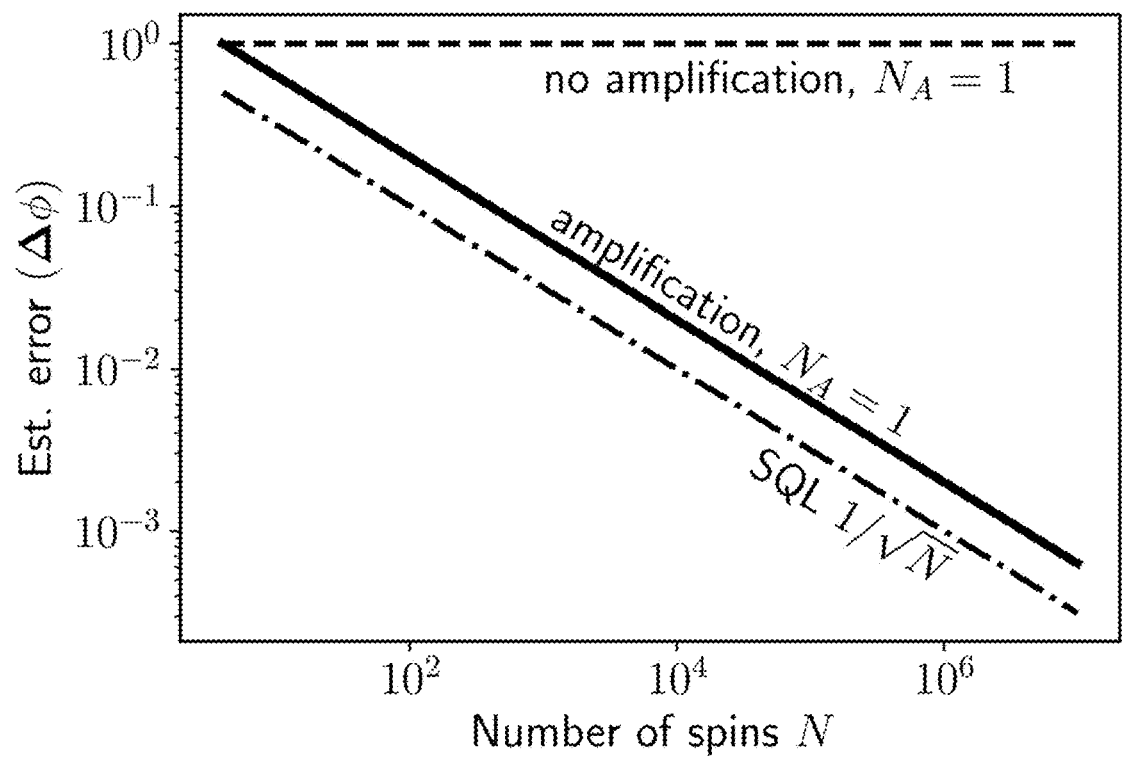
FIGS. 4A and 4B are plots of estimation error if only a subensemble is read out after amplification.
Figure 4B:
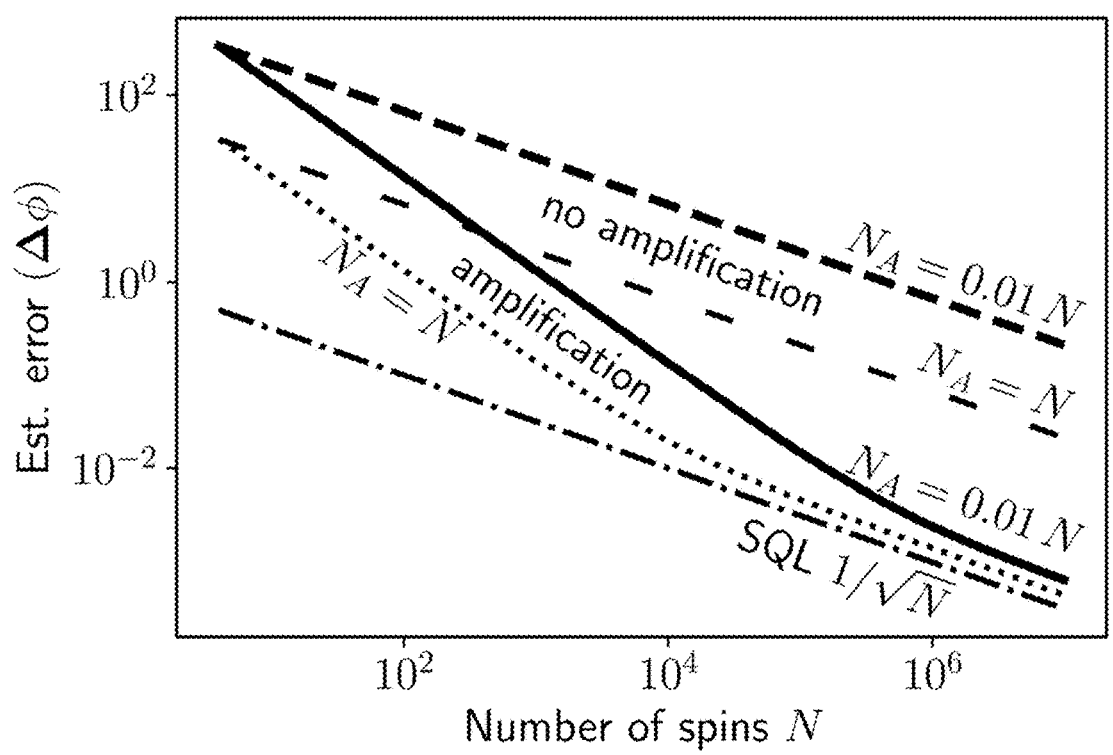

FIGS. 4A and 4B are plots of estimation error $(\Delta\phi)$ if only a subensemble of size $N_A < N$ is read out after the amplification step (see Eqn. 20). The superradiant decay dynamics involves all N spins, therefore, the gain factor still scales $\propto \sqrt{N}$. FIG. 4A shows that even if only a single spin is measured (i.e., $N_A=1$) amplification allows one to reduce the estimation error with a SQL-like scaling $(\Delta\phi) \propto 1/\sqrt{N}$. Here, we consider the ideal case $\Xi_{det}^2=0$; adding detection noise will only change a constant prefactor which shifts the dashed blue and solid red curves vertically relative to the dash-dotted SQL curve.

FIG. 4B shows a comparison between a measurement of the full ensemble, $N_A=N$, and a measurement of only a small subensemble, $N_A=0.01N$, in the presence of detection noise, $\Xi_{det}^2=67$. For the subensemble, the initial estimation error is higher due to the smaller number of measured spins but the gain still allows one to reduce the readout noise with a $1/N$-like scaling until intrinsic and added noise become appreciable. The plots are based on Eqn. 20, the MFT scaling relations (i.e., $c_0=\frac{1}{2}$, $\sigma_{add}^2=1$), and a worst-case estimate $q=1$ (equivalent to maximum $(\Delta S_y^A)^2$ fluctuations of the measured subensemble).

VI. Impact of Single-Spin Dissipation and Finite-Temperature in the Generic Model While our superradiant dissipative spin amplifier exhibits remarkable performance in the ideal case where the only dissipation is the desirable collective loss in Eqn. 3, it is also crucial to understand what happens when additional unwanted forms of common dissipation are added.

1. Local Dissipation

We first consider the impact of single-spin dissipation, namely Markovian dephasing and relaxation at rates $\gamma_\phi$ and $\gamma_{rel}$, respectively. The master equation for our spin ensemble now takes the form $$\frac{d\hat{\rho}}{dt} = \Gamma \mathcal{D}[\hat{S}_-]\hat{\rho} + \gamma_{rel}\sum_{j=1}^{N}\mathcal{D}[\hat{\sigma}_-^{(j)}]\hat{\rho} + \frac{\gamma_\phi}{2}\sum_{j=1}^{N}\mathcal{D}[\hat{\sigma}_z^{(j)}]\hat{\rho}. \quad (21)$$

Numerically exact solutions of Eqn. 21, shown in FIG. 5, demonstrate that an initial signal is still amplified if the collective cooperativities $$C_k = \frac{N\Gamma}{\gamma_k}, \quad (22)$$

with $k \in \{\phi, rel\}$, exceed a threshold value of the order of unity. This is equivalent to the threshold condition for superradiant lasing [46,66]. Further, we find that achieving the maximum gain $G \propto \sqrt{N}$ does not require strong coupling at the single-spin level: it only requires a large collective cooperativity, and not a large single-spin cooperativity $\eta_k \equiv C_k/N$.

Figure 5A:
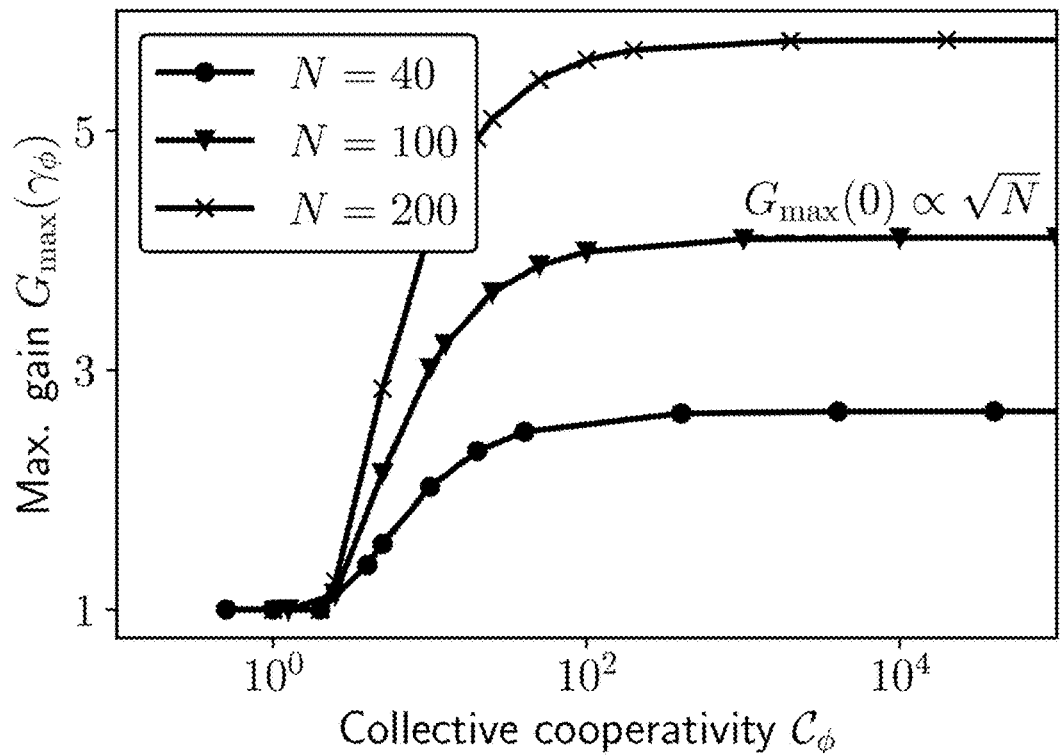
FIG. 5A is a plot of the maximum gain in the presence of local dephasing as a function of collective cooperativity.

FIG. 5A is a plot of maximum gain in the presence of local dephasing, $G_{max}(\gamma_\phi)$, as a function of the collective cooperativity $C_\phi = N\Gamma/\gamma_\phi$ (calculated by numerically exact integration of the Eqn. 3 with $\gamma_{rel}=0$). Each data point was obtained by maximizing the time-dependent gain $G(t)$ over the evolution time t. Collective amplification and local dephasing compete and amplification is observed if $C_\phi \geq 2$, i.e., if the collective amplification rate dominates over local decay.

Figure 5B:
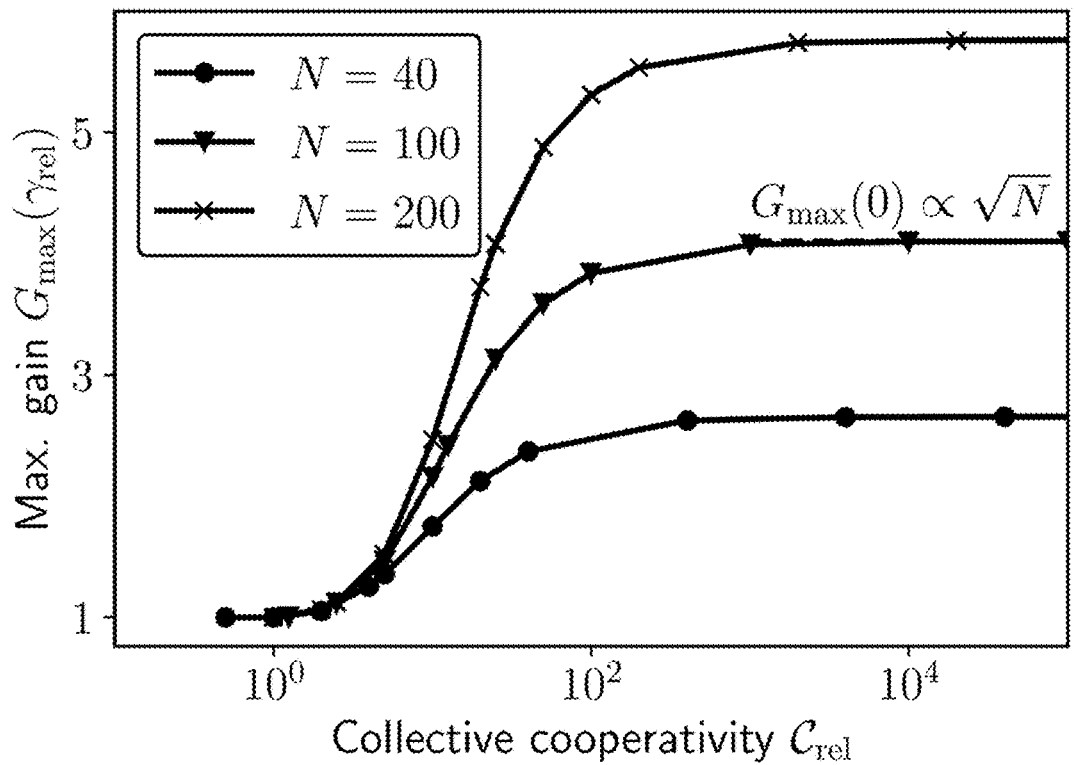
FIG. 5B shows results similar to those in FIG. 5A for maximum gain in the presence of local relaxation as a function of the collective cooperativity.

FIG. 5B is a plot similar to that in FIG. 5A with analogous numerical results for maximum gain in the presence of local relaxation, $G_{max}(\gamma_{rel})$, as a function of the collective cooperativity $C_{rel}=N\Gamma/\gamma_{rel}$ (with $\gamma_\phi=0$). We again see that the collective cooperativity is the relevant parameter for obtaining maximum gain.

Note that the dependence of the gain on cooperativity can be understood at a heuristic level by inspecting the MFT equations of motion (i.e., Eqn. 6), which now take the form:

$$\frac{dS_{x,y}}{dt} = \Gamma\left(S_z - \frac{1}{2}\right)S_{x,y} - \gamma_\phi S_{x,y} - \frac{\gamma_{rel}}{2}S_{x,y}. \quad (23)$$

At short times, the collective decay term tends to increase $S_y$ at a rate $N\Gamma$ whereas local dissipation aims to decrease $S_y$ at rates $\gamma_\phi$ and $\gamma_{rel}/2$, respectively. Amplification is only possible if the slope of $S_y$ at $t=0$ is positive, which is equivalent to the conditions $C_\phi > 1$ and $C_{rel} > \frac{1}{2}$, respectively. For weak local dissipation, i.e., $C_k >> 1$, the numerical results shown in FIG. 5 are well described by the mean-field result $$G_{max}(\gamma_k) = G_{max}(0)\left(1 - \frac{a_k}{C_k}\right), \quad (24)$$

where $a_\phi \approx 3$ and $a_{rel} \approx 6$. In the limit $C_k << 1$, there is no amplification, $G_{max}(\gamma_k)=1$.

2. Finite Temperature

Another potential imperfection is that the reservoir responsible for collective relaxation may not be at zero temperature, giving rise to an unwanted collective excitation process. This could be relevant in setups where collective effects stem from coupling to a mechanical degree of freedom, a promising approach for ensembles of defect spins in solids [57,58,60]. In this general case, the master equation takes the form $$\frac{d\hat{\rho}}{dt} = \Gamma(n_{th}+1)\mathcal{D}[\hat{S}_-]\hat{\rho} + \Gamma n_{th}\mathcal{D}[\hat{S}_+]\hat{\rho}. \quad (25)$$

Figure 6:
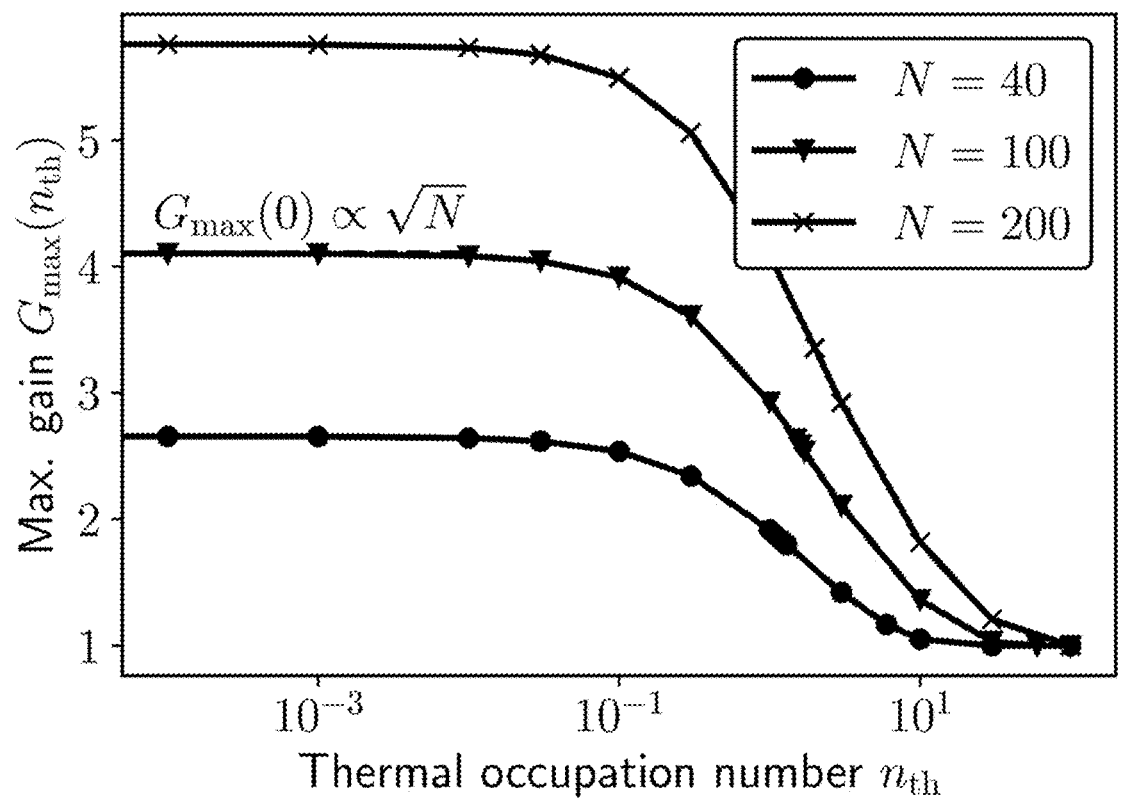
FIG. 6 is a plot of maximum gain in the presence of a non-zero thermal occupancy of the environment responsible for collective spin decay.

The parameter $n_{th}$ determines the relative strength between the collective decay and excitation rates and can be interpreted as an effective thermal occupation of the bath generating the collective decay. The gain as a function of the effective thermal occupation number $n_{th}$ based on numerically exact solution of the full quantum master equation (i.e., Eqn. 25) is shown in FIG. 6. A nonzero $n_{th}$ reduces the gain as compared to the ideal gain $G_{max}$ obtained for $n_{th}=0$, and ultimately prevents any amplification in the limit $n_{th} >> 1$.

FIG. 6 is a plot of maximum gain in the presence of a non-zero thermal occupancy of the environment responsible for collective spin decay. The plot of FIG. 6 was obtained from the numerically exact solution of the Eqn. 3. Each data point was obtained by maximizing the gain G(t) over the evolution time t. FIG. 6 shows that a non-zero bath thermal occupancy rapidly degrades gain. At a heuristic level, the decay of the ensemble's z polarization is seeded by both thermal and quantum bath fluctuations. Non-zero thermal fluctuations hence accelerate the decay, leading to a shorter time interval where the instantaneous gain rate $\lambda(t)$ is positive. This allows one to quantitatively understand the suppression of maximum gain seen here (see Eqn. 29).

MFT again allows one to develop an intuitive picture of how a bath temperature degrades amplification dynamics. In the presence of finite temperature and for large N, Eqns. 5 and 6 read $$\frac{dS_{x,y}}{dt} = \Gamma\left(S_z - \frac{1}{2} - n_{th}\right)S_{x,y}, \tag{26}$$

$$\frac{dS_z}{dt} = -\Gamma\frac{N^2}{4} - \Gamma S_z(1 + 2n_{th} - S_z). \tag{27}$$

The impact of finite temperature $n_{th}>0$ is thus twofold. First, the time-dependent gain factor in Eqn. 26 is shut off at an earlier time, namely, if the condition $S_z(t)=\frac{1}{2}+n_{th}$ holds. This implies that no amplification will occur if $n_{th}>N/2$. If this were the only effect, the generation of gain would be largely insensitive to thermal occupancies $n_{th}<<N$. Unfortunately, there is a second, more damaging mechanism. As the above equations show, the instantaneous gain rate $\lambda(t)$ is controlled by $S_z(t)$. The decay of this polarization is seeded by both quantum and thermal fluctuations in the environment. Hence, a non-zero $n_{th}$ accelerates this decay, leading to a more rapid decay of polarization, and a shorter time interval where the instantaneous gain rate is positive. This ultimately suppresses the maximum gain.

The above argument can be made quantitative if we expand $S_z$ for short times around its initial value, $S_z=N/2-\delta$, where $\delta<<1$. To leading order in N and $\delta$, the equation of motion of the deviation $\delta$ is $d\delta/dt=N\Gamma(1+n_{th})+N\Gamma\delta$, where the first term shows explicitly that both bath vacuum fluctuations and thermal fluctuations drive the initial decay of polarization. As a consequence, the superradiant emission occurs faster and, in the limit $N>>1+2n_{th}$, the time to reach maximum amplification is $$\Gamma t_{max} = \frac{1}{N}\ln\frac{N - n_{th}}{n_{th} + 1}. \tag{28}$$

In the same limit, the maximum gain is given by $$G_{max}(n_{th}) = \frac{G_{max}(0)}{\sqrt{1 + n_{th}}}, \tag{29}$$

which shows that a thermal occupation of $n_{th}=3$ will decrease the gain by 3 dB. Note that $G_{max}(n_{th})$ still scales $\propto \sqrt{N}$, i.e., for a fixed value of $n_{th}$, the reduction can be compensated by increasing the number of spins. The experimental demonstration of superradiance in NV-center spins was performed at 25 mK [67]. The spins were resonant with a microwave cavity at a frequency of about 3 GHz, which corresponds to a thermal occupation of $n_{th} \approx 0.002 <<1$.

VII. Implementation Using Cavity-Mediated Dissipation

While there are many ways to engineer the collective relaxation that powers our superradiant amplifier, we specialize here to a ubiquitous realization that allows the tuneability we require: couple the spin ensemble to a common lossy bosonic mode. To that end, we consider a setup where N spin-½ systems are coupled to a damped bosonic mode â by a standard Tavis-Cummings coupling (see FIG. 7):

$$\hat{H} = \omega_{cav}\hat{a}^\dagger\hat{a} + \sum_{j=1}^{N}\omega_j\frac{\hat{\sigma}_z^{(j)}}{2} + \sum_{j=1}^{N}g_j(\hat{\sigma}_-^{(j)}\hat{a}^\dagger + \hat{\sigma}_+^{(j)}\hat{a}). \tag{30}$$

Here, $\omega_{cav}$ and $\omega_j$ denote the frequencies of the bosonic mode and the spins, respectively, and $g_j$ denotes the coupling strength of spin j to the bosonic mode. The bosonic mode is damped at an energy decay rate $\kappa$ and the entire system is thus described by the quantum master equation $$\frac{d\hat{\rho}}{dt} = -i[\hat{H}, \hat{\rho}] + \kappa\mathcal{D}[\hat{a}]\hat{\rho}. \tag{31}$$

For collective phenomena, we ideally want all atoms to have the same frequency $\omega_j=\bar{\omega}$ and be equally coupled to the cavity, $g_j=g$. For superradiant decay, we further want the spins to be resonant with the cavity, i.e., have zero detuning $\omega_{cav}-\bar{\omega}=0$. If, in addition, the bosonic mode is strongly damped, $\kappa>>\sqrt{N}g$, the â mode can be eliminated adiabatically, which gives rise to the spin-only master equation 3 with a collective decay rate $$\Gamma = \frac{4g^2}{\kappa} \tag{32}$$

and $\gamma_{rel}=0$.

Figure 7:
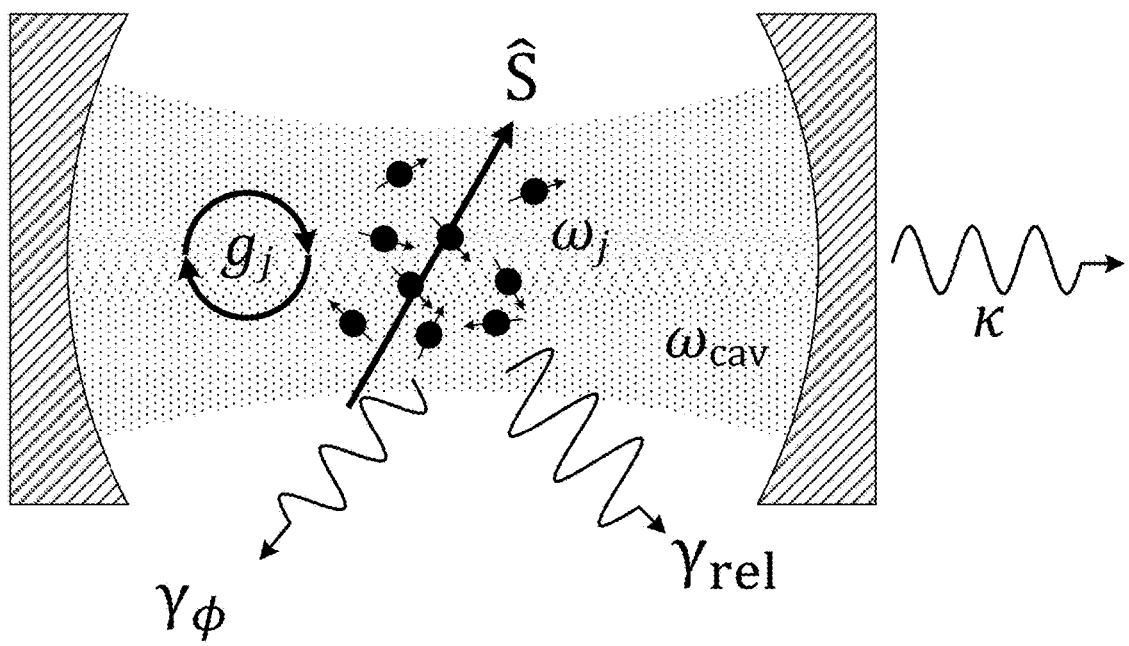
FIG. 7 illustrates how collective decay can be implemented experimentally by coupling spin-½ systems to a strongly damped bosonic mode, in an embodiment.

FIG. 7 illustrates how the collective decay described by Eqns. 3 and 21 can be implemented experimentally by coupling N spin-½ systems (level splittings $\omega_j$) to a strongly damped bosonic mode (frequency $\omega_{cav}$ and single-spin coupling strengths $g_j$). The mode is depicted here as a resonant mode of a photonic cavity, but one could use a wide variety of systems (e.g. microwave or mechanical modes). The energy decay rate of the bosonic mode is $\kappa$ and each spin may undergo local relaxation or dephasing processes at rates $\gamma_{rel}$ or $\gamma_\phi$, respectively.

Returning to FIG. 1, note that a crucial part of our protocol is the ability to turn on and off the collective dissipation on demand (i.e., to start the amplification dynamics at the appropriate point in the measurement sequence, and then turn it off once maximum gain is reached). This implementation provides a variety of means for doing this. Perhaps the simplest is to control the spin-cavity detuning $\Delta$ by, e.g. changing the applied z magnetic field on the spins. In the limit of an extremely large detuning, the superradiant decay rate $\Gamma$ is suppressed compared to Eqn. 32 by the small factor $\kappa^2/(\kappa^2+4\Delta^2)<<1$.

In the following, we separately analyze the impact of coupling inhomogeneities, $g_j \neq g$, and of inhomogeneous broadening, $\omega_j \neq \bar{w}$.

1. Non-Uniform Single-Spin Couplings

To analyze the impact of inhomogeneous coupling parameters $g_j$, we follow the standard approach outlined in Ref. [44]. It uses an expansion of the mean-field equations to leading order in the deviations $\delta_j = g_j - \bar{g}$ of the average coupling $\bar{g} = \sum_{j=1}^{N} g_j/N$ and retains only leading-order terms in the equations of motion for $S_x$ and $S_y$. The impact of inhomogeneous couplings is then to reduce the effective length of the collective spin vector associated with the ensemble by the factor $$\mu = \frac{1}{N} \frac{\sum_{k=1}^{N} \sum_{l=1, l \neq k}^{N} g_k g_l}{\sum_{k=1}^{N} g_k^2}, \quad (33)$$

i.e., the maximum gain and the optimal time are now given by $G_{ci} = \sqrt{\mu N}/2$ and $t_{max}^{ci} = \ln(\mu N)/\gamma_\phi \mu N$, respectively, where we defined $\gamma_\phi = \sum_{k=1}^{N} 4 g_k^2/\kappa N$. Hence, the maximum gain $G_{max}$ is reduced by a disorder-dependent prefactor, but the fundamental scaling is retained.

2. Inhomogeneous Broadening

Figure 8:
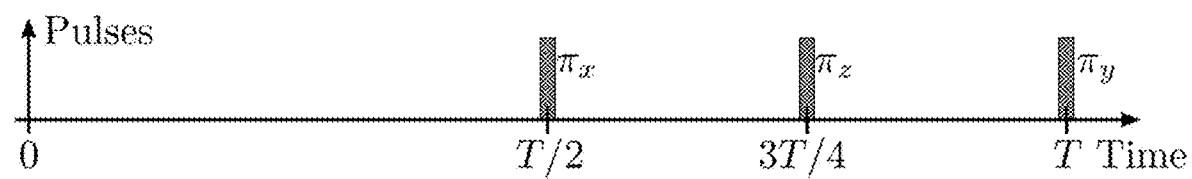
FIG. 8 illustrates a dynamical decoupling sequence to cancel inhomogeneous broadening.

Inhomogeneous broadening can be canceled by the dynamical decoupling sequence introduced recently in Ref. [68] (see FIG. 8). Different spin transition frequencies $\omega_j$ in Eqn. 30 lead to a dephasing of the individual spins in the ensemble, which can be compensated by a $\pi$ pulse about the x axis halfway through the sequence. However, this pulse will modify the interaction term in Eqn. 30 and will turn collective decay into collective excitation. This can be compensated by a $\pi$ pulse about the z axis at time $3T/4$, which changes the sign of the coupling constants $g_j$. Note that such a pulse can be generated using a combination of x and y rotations. The final $\pi$ pulse about the y axis at time T reverts all previous operations and restores the original Hamiltonian of Eqn. 30. The average Hamiltonian of this pulse sequence in a frame rotating at $\omega_0$ is $$\overline{H} = \sum_{j=1}^{N} \frac{g_j}{2} \left( \hat{\sigma}_+^{(j)} \hat{a} + \hat{\sigma}_-^{(j)} \hat{a}^\dagger \right) \quad (34)$$

if the repetition rate $1/T$ of the decoupling sequence is much larger than the standard deviation of the distribution of the frequencies $\omega_j$. More details on the derivation of this decoupling sequence are provided in Ref. [68]. If one chooses not to use dynamical decoupling, the analysis outlined in Section F can be adapted to estimate the effect of inhomogeneous broadening on the superradiant decay dynamics [63].

FIG. 8 illustrates a dynamical decoupling sequence to cancel inhomogeneous broadening in the Hamiltonian of Eqn. 30. The $\pi$ pulse about the x axis cancels disorder in the spin frequencies $\omega_j$. The subsequent $\pi$ pulses about the z and y axis compensate unwanted interaction terms generated by the first $\pi$ pulse. The overall pulse sequence is applied repeatedly and generates the average Hamiltonian of Eqn. 34 if the repetition rate $1/T$ is much larger than the standard deviation of the distribution of the spin transition frequencies $\omega_j$.

3. Limit of Undamped Cavity

Returning to the cavity-based implementation of the superradiant spin amplifier in Eqns. 30 and 31, one might worry about whether this physics also persists in regime where the cavity damping rate $\kappa$ is not large enough to allow for an adiabatic elimination. To address this, we briefly consider the extreme limit of this situation, $\kappa \to 0$, where we simply obtain a completely unitary dynamics generated by the resonant Tavis-Cummings Hamiltonian $$\hat{H}_{TC} = \omega_{cav} \hat{a}^\dagger \hat{a} + \omega \hat{S}_z + g(\hat{S}_- \hat{a}^\dagger + \hat{S}_+ \hat{a}), \quad (35)$$

where to $\omega_{cav} = \omega$. FIG. 9 shows numerical results for the time-maximized gain $G_{max}$ starting from an initial state $e^{i\phi \hat{S}_x} |\uparrow \ldots \uparrow\rangle \otimes |0\rangle$, where $|0\rangle$ denotes the vacuum state of the cavity. A complementing analysis based on MFT is discussed in Ref [53]. We find that spin amplification dynamics still holds in the unitary regime, with an identical $G_{max} \propto \sqrt{N}$ scaling of the maximum gain. We stress that realizing this limit of fully unitary collective dynamics is challenging in most spin ensemble sensing platforms. Nonetheless, this limit shows that our amplification dynamics will survive even if the adiabatic elimination condition $\sqrt{N} g \ll \kappa$ that leads to Eqn. 31 is not perfectly satisfied. This further enhances the experimental flexibility of our scheme.

Figure 9A:
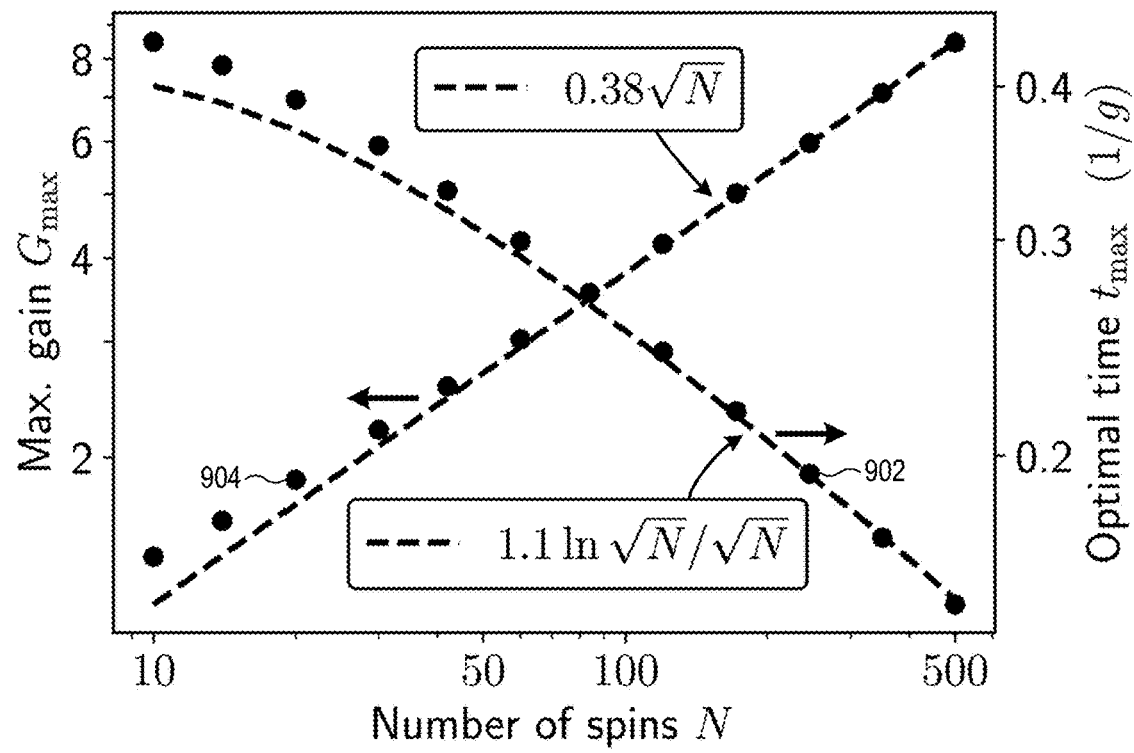
FIGS. 9A and 9B illustrate coherent spin amplification in a cavity-spin system described by the resonant Tavis-Cummings Hamiltonian, in embodiments.

Although both the dissipative and the unitary case yield $G_{max} \propto \sqrt{N}$, the underlying dynamics is quite different. The time $t_{max}$ to reach maximum amplification in the coherent case, shown in FIG. 9A, is parametrically longer if we consider the limit of a large number of spins N: $t_{max} \propto \ln\sqrt{N}/\sqrt{N}$ (as opposed to a $t_{max} \propto \ln N/N$ scaling in the dissipative case). Consequently, the instantaneous gain rates $\lambda(t)$ are also quite different in both cases: whereas dissipative superradiant decay has an almost constant instantaneous gain rate over a short time, the gain in the Tavis-Cummings model is non-monotonic, starts at zero, and grows at short times, as shown in FIG. 9B.

Figure 9B:
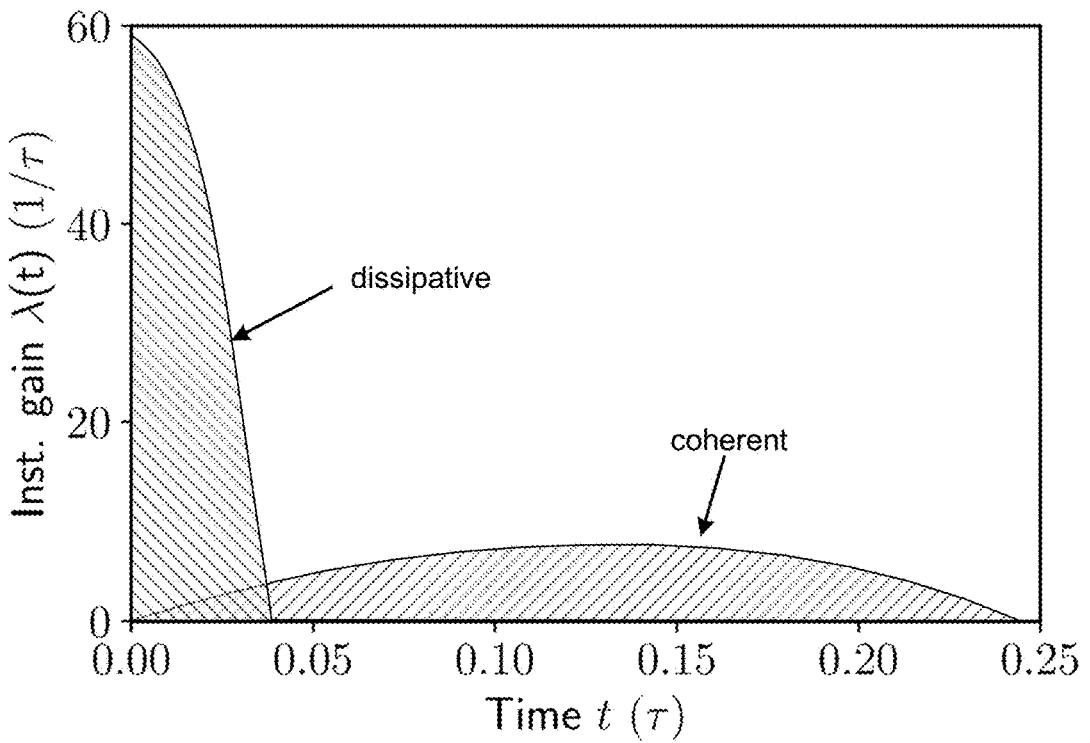

FIGS. 9A and 9B illustrate coherent spin amplification in a cavity-spin system described by the resonant Tavis-Cummings Hamiltonian of Eqn. 35 with $\omega_{cav} = \omega$ and the initial state $e^{i\phi \hat{S}_x} |\uparrow \ldots \uparrow\rangle \otimes |0\rangle$. FIG. 9A is a plot of maximum gain $G_{max}$ and optimal evolution time $t_{max}$ as a function of the number of spins N. The maximum gain $G_{max}$ follows the same $\sqrt{N}$ scaling as in the dissipative case, while the optimal evolution time $t_{max} \propto \ln\sqrt{N}/\sqrt{N}$, has a different N-dependence than the corresponding time $t_{max} \propto \ln N/N$ in the dissipative case (cf. FIG. 2A). The data points in FIG. 9A were obtained by solving the Schrödinger equation while the dashed curves show the corresponding large-N scaling behavior.

FIG. 9B is a plot the instantaneous gain $\lambda(t) = [d\langle \hat{S}_y(t)\rangle/dt]/\langle \hat{S}_y(t)\rangle$ as a function of time for coherent (see data set 902) and dissipative (see data set 904) amplification protocols with N=120 spins. The time scale $\tau$, which is N-independent, is $1/g$ and $1/\Gamma$ for the coherent and dissipative cases, respectively. The maximum gain $G_{max}$ shown in FIG. 9A corresponds to the integral of $\lambda(t)$ between t=0 and t=$t_{max}$ (i.e., the shaded regions), which are nearly equal in both cases. All numerical results in FIGS. 9A and 9B for the unitary scheme are obtained by numerically integrating the Schrödinger equation with the Hamiltonian of Eqn. 35.

Note that, for the coherent Tavis-Cummings model, the timescale for maximum amplification is analogous to the timescale that governs quasi-periodic oscillations of excitation number in the large-N limit; this latter phenomenon has been derived analytically in Refs. [69-71]. However, the semiclassical approach used in these works fails to accurately describe the gain physics that is of interest here (see Ref. [53]). Finally, Ref [53] shows that the added noise in the unitary case is also close to the expected quantum limit. Surprisingly, it is approximately equal to what we have found in the dissipative limit, $\sigma_{add}^2 \approx 1.3$.

VIII. Experimental Implementations

The focus of the previous discussion is not on one specific experimental platform, but is rather to illuminate the general physics of the collective spin amplification process, a mechanism relevant to many different potential systems. While there are many atomic, molecular, and optical platforms capable of realizing our resonant, dissipative Tavis- Cummings model, we wish to particularly highlight potential solid-state implementations based on defect spins. These systems have considerable promise in the context of quantum sensing, but usually suffer from the practical obstacle that the ensemble readout is far above the SQL [16].

Recent work has experimentally demonstrated superradiance effects in sensing-compatible solid-state spin ensembles [67,76]. Angerer et al. [67] demonstrated superradiant optical emission from $N \approx 10^{16}$ negatively charged NV centers, which were homogeneously coupled to a microwave cavity mode in the fast cavity limit, i.e., with a decay rate $\kappa$ much larger than all other characteristic rates in the system. Moreover, improved setups with collective cooperativities larger than unity were reported and ways to increase the collective cooperativities even more have been discussed [21,77]. The essential ingredients to observe superradiant spin amplification in large ensembles of NV defects coupled to microwave modes have thus been demonstrated experimentally. Instead of a microwave cavity mode, the bosonic mode a could also be implemented by a mechanical mode that is strain-coupled to defect centers [78], e.g. employing mechanical cantilevers [57], optomechanical crystals [60], bulk resonators [68], or surface-acoustic-wave resonators [79]. In addition to NV centers, silicon vacancy (SiV) defect centers could be used [80,81], which offer larger and field-tunable spin-mechanical coupling rates. Superradiant amplification could then pave a way to dramatically reduce the detrimental impact of detection noise and to approach SQL scaling.

Changes may be made in the above methods and systems without departing from the scope hereof. It should thus be noted that the matter contained in the above description or shown in the accompanying drawings should be interpreted as illustrative and not in a limiting sense. The following claims are intended to cover all generic and specific features described herein, as well as all statements of the scope of the present method and system, which, as a matter of language, might be said to fall therebetween.

REFERENCES

[1] M. H. Schleier-Smith, I. D. Leroux, and V. Vuletić, States of an Ensemble of Two-Level Atoms with Reduced Quantum Uncertainty, Phys. Rev. Lett. 104, 073604 (2010).

[2] K. C. Cox, G. P. Greve, J. M. Weiner, and J. K. Thompson, Deterministic Squeezed States with Collective Measurements and Feedback, Phys. Rev. Lett. 116, 093602 (2016).

[3] O. Hosten, R. Krishnakumar, N. J. Engelsen, and M. A. Kasevich, Quantum phase magnification, Science 352, 1552 (2016).

[4] V. M. Acosta, E. Bauch, M. P. Ledbetter, C. Santori, K. M. C. Fu, P. E. Barclay, R. G. Beausoleil, H. Linget, J. F. Roch, F. Treussart, S. Chemerisov, W. Gawlik, and D. Budker, Diamonds with a high density of nitrogen-vacancy centers for magnetometry applications, Phys. Rev. B 80, 115202 (2009).

[5] S. Steinert, F. Dolde, P. Neumann, A. Aird, B. Naydenov, G. Balasubramanian, F. Jelezko, and J. Wrachtrup, High sensitivity magnetic imaging using an array of spins in diamond, Rev. Sci. Instrum. 81, 043705 (2010).

[6] L. M. Pham, D. L. Sage, P. L. Stanwix, T. K. Yeung, D. Glenn, A. Trifonov, P. Cappellaro, P. R. Hemmer, M. D. Lukin, H. Park, A. Yacoby, and R. L. Walsworth, Magnetic field imaging with nitrogen-vacancy ensembles, New J. Phys. 13, 045021 (2011).

[7] T. Wolf, P. Neumann, K. Nakamura, H. Sumiya, T. Ohshima, J. Isoya, and J. Wrachtrup, Subpicotesla diamond magnetometry, Phys. Rev. X 5, 041001 (2015).

[8] J. M. Taylor, P. Cappellaro, L. Childress, L. Jiang, D. Budker, P. R. Hemmer, A. Yacoby, R. Walsworth, and M. D. Lukin, High-sensitivity diamond magnetometer with nanoscale resolution, Nat. Phys. 4, 810 (2008).

[9] L. Rondin, J.-P. Tetienne, T. Hingant, J.-F. Roch, P. Maletinsky, and V. Jacques, Magnetometry with nitrogen vacancy defects in diamond, Rep. Prog. Phys. 77, 056503 (2014).

[10] F. Dolde, H. Fedder, M. W. Doherty, T. Nobauer, F. Rempp, G. Balasubramanian, T. Wolf, F. Reinhard, L. C. L. Hollenberg, F. Jelezko, and J. Wrachtrup, Electric-field sensing using single diamond spins, Nat. Phys. 7, 459 (2011).

[11] V. M. Acosta, E. Bauch, M. P. Ledbetter, A. Waxman, L.-S. Bouchard, and D. Budker, Temperature Dependence of the Nitrogen-Vacancy Magnetic Resonance in Diamond, Phys. Rev. Lett. 104, 070801 (2010).

[12] M. Kitagawa and M. Ueda, Squeezed spin states, Phys. Rev. A 47, 5138 (1993).

[13] J. Ma, X. Wang, C. Sun, and F. Nori, Quantum spin squeezing, Phys. Rep. 509, 89 (2011).

[14] L. Pezze, A. Smerzi, M. K. Oberthaler, R. Schmied, and P. Treutlein, Quantum metrology with nonclassical states of atomic ensembles, Rev. Mod. Phys. 90, 035005 (2018).

[15] C. L. Degen, F. Reinhard, and P. Cappellaro, Quantum sensing, Rev. Mod. Phys. 89, 035002 (2017).

[16] J. F. Barry, J. M. Schloss, E. Bauch, M. J. Turner, C. A. Hart, L. M. Pham, and R. L. Walsworth, Sensitivity optimization for nv-diamond magnetometry, Rev. Mod. Phys. 92, 015004 (2020).

[17] P. Neumann, J. Beck, M. Steiner, F. Rempp, H. Fedder, P. R. Hemmer, J. Wrachtrup, and F. Jelezko, Single-shot readout of a single nuclear spin, Science 329, 542 (2010).

[18] B. J. Shields, Q. P. Unterreithmeier, N. P. de Leon, H. Park, and M. D. Lukin, Efficient Readout of a Single Spin State in Diamond via Spin-to-Charge Conversion, Phys. Rev. Lett. 114, 136402 (2015).

[19] J. C. Jaskula, B. J. Shields, E. Bauch, M. D. Lukin, A. S. Trifonov, and R. L. Walsworth, Improved Quantum Sensing with a Single Solid-State Spin via Spin-to-Charge Conversion, Phys. Rev. Appl. 11, 064003 (2019).

[20] D. M. Irber, F. Poggiali, F. Kong, M. Kieschnick, T. Luhmann, D. Kwiatkowski, J. Meijer, J. Du, F. Shi, and F. Reinhard, Robust all-optical single-shot readout of nitrogen vacancy centers in diamond, Nat. Commun. 12, 532 (2021).

[21] E. R. Eisenach, J. F. Barry, M. F. O'Keeffe, J. M. Schloss, M. H. Steinecker, D. R. Englund, and D. A. Braje, Cavity enhanced microwave readout of a solid-state spin sensor, Nat. Commun. 12, 1357 (2021).

[22] C. M. Caves, Quantum limits on noise in linear amplifiers, Phys. Rev. D 26, 1817 (1982).

[23] B. Yurke, S. L. McCall, and J. R. Klauder, SU(2) and SU(1,1) interferometers, Phys. Rev. A 33, 4033 (1986).

[24] M. Jiang, Y. Qin, X. Wang, Y. Wang, H. Su, X. Peng, and D. Budker, Floquet Spin Amplification, Phys. Rev. Lett. 128, 233201 (2022).

[25] A. McDonald and A. A. Clerk, Exponentially-enhanced quantum sensing with non-Hermitian lattice dynamics, Nat. Commun. 11, 5382 (2020).

[26] E. Davis, G. Bentsen, and M. Schleier-Smith, Approaching the Heisenberg Limit without Single-Particle Detection, Phys. Rev. Lett. 116, 053601 (2016).

[27] F. Frowis, P. Sekatski, and W. Dur, Detecting Large Quantum Fisher Information with Finite Measurement Precision, Phys. Rev. Lett. 116, 090801 (2016).

[28] T. Macri, A. Smerzi, and L. Pezze, Loschmidt echo for quantum metrology, Phys. Rev. A 94, 010102(R) (2016).

[29] E. Davis, G. Bentsen, T. Li, and M. Schleier-Smith, in *Advances in Photonics of Quantum Computing, Memory, and Communication X*, Vol. 10118, edited by Z. U. Hasan, P. R. Hemmer, H. Lee, and A. L. Migdall, International Society for Optics and Photonics (SPIE, 2017), p. 104.

[30] S. A. Haine, Using interaction-based readouts to approach the ultimate limit of detection-noise robustness for quantum-enhanced metrology in collective spin systems, Phys. Rev. A 98, 030303(R) (2018).

[31] F. Anders, L. Pezze, A. Smerzi, and C. Klempt, Phase magnification by two-axis countertwisting for detection-noise robust interferometry, Phys. Rev. A 97, 043813 (2018).

[32] M. Schulte, V. J. Martinez-Lahuerta, M. S. Scharnagl, and K. Hammerer, Ramsey interferometry with generalized one-axis twisting echoes, Quantum 4, 268 (2020).

[33] D. Leibfried, M. D. Barrett, T. Schaetz, J. Britton, J. Chiaverini, W. M. Itano, J. D. Jost, C. Langer, and D. J. Wineland, Toward Heisenberg-limited spectroscopy with multiparticle entangled states, Science 304, 1476 (2004).

[34] D. Leibfried, E. Knill, S. Seidelin, J. Britton, R. B. Blakestad, J. Chiaverini, D. B. Hume, W. M. Itano, J. D. Jost, C. Langer, R. Ozeri, R. Reichle, and D. J. Wineland, Creation of a six-atom Schrodinger cat state, Nature 438, 639 (2005).

[35] S. P. Nolan, S. S. Szigeti, and S. A. Haine, Optimal and Robust Quantum Metrology Using Interaction-Based Readouts, Phys. Rev. Lett. 119, 193601 (2017).

[36] D. Linnemann, H. Strobel, W. Muessel, J. Schulz, R. J. Lewis-Swan, K. V. Kheruntsyan, and M. K. Oberthaler, Quantum-Enhanced Sensing Based on Time Reversal of Nonlinear Dynamics, Phys. Rev. Lett. 117, 013001 (2016).

[37] S. Colombo, E. P.-Peñafiel, A. F. Adiyatullin, Z. Li, E. Mendez, C. Shu, and V. Vuletić, Time-reversal-based quantum metrology with many-body entangled states, arXiv (2021), ArXiv:2106.03754v3.

[38] S. C. Burd, R. Srinivas, J. J. Bollinger, A. C. Wilson, D. J. Wineland, D. Leibfried, D. H. Slichter, and D. T. C. Allcock, Quantum amplification of mechanical oscillator motion, Science 364, 1163 (2019).

[39] A. A. Clerk, M. H. Devoret, S. M. Girvin, F. Marquardt, and R. J. Schoelkopf, Introduction to quantum noise, measurement, and amplification, Rev. Mod. Phys. 82, 1155 (2010).

[40] R. H. Dicke, Coherence in spontaneous radiation processes, Phys. Rev. 93, 99 (1954).

[41] A. V. Andreev, V. I. Emel'yanov, and Y. A. Il'inskii, Collective spontaneous emission (Dicke superradiance), Sov. Phys. Usp. 23, 493 (1980).

[42] M. Gross and S. Haroche, Superradiance: An essay on the theory of collective spontaneous emission, Phys. Rep. 93, 301 (1982).

[43] M. G. Benedict, A. M. Ermolaev, V. A. Malyshev, I. V. Sokolov, and E. D. Trifonov, *Super-Radiance: Multi-atomic Coherent Emission* (Taylor & Francis Group, New York, 1996).

[44] G. S. Agarwal, Master-equation approach to spontaneous emission, Phys. Rev. A 2, 2038 (1970).

[45] N. E. Rehler and J. H. Eberly, Superradiance, Phys. Rev. A 3, 1735 (1971).

[46] J. G. Bohnet, Z. Chen, J. M. Weiner, D. Meiser, M. J. Holland, and J. K. Thompson, A steady-state superradiant laser with less than one intracavity photon, Nature 484, 78 (2012).

[47] J. G. Bohnet, Z. Chen, J. M. Weiner, K. C. Cox, and J. K. Thompson, Active and passive sensing of collective atomic coherence in a superradiant laser, Phys. Rev. A 88, 013826 (2013).

[48] P. Cappellaro, J. Emerson, N. Boulant, C. Ramanathan, S. Lloyd, and D. G. Cory, *Quantum Computing in Solid State Systems* (Springer, New York, 2006) Chap. Spin amplifier for single spin measurement, p. 306.

[49] M. Schaffry, E. M. Gauger, J. J. L. Morton, and S. C. Benjamin, Proposed Spin Amplification for Magnetic Sensors Employing Crystal Defects, Phys. Rev. Lett. 107, 207210 (2011).

[50] N. Bloembergen and R. V. Pound, Radiation damping in magnetic resonance experiments, Phys. Rev. 95, 8 (1954).

[51] M. P. Augustine, S. D. Bush, and E. L. Hahn, Noise triggering of radiation damping from the inverted state, Chem. Phys. Lett. 322, 111 (2000).

[52] J. D. Walls, S. Y. Huang, and Y.-Y. Lin, Spin amplification in solution magnetic resonance using radiation damping, J. Chem. Phys. 127, 054507 (2007).

[53] See the Supplemental Material at http://link.aps.org/supplemental/10.1103/PRXQuantum.3.030330.

[54] J. Riedrich-Moller, L. Kipfstuhl, C. Hepp, E. Neu, C. Pauly, F. Mucklich, A. Baur, M. Wandt, S. Wolff, M. Fischer, S. Gsell, M. Schreck, and C. Becher, One- and two-dimensional photonic crystal microcavities in single crystal diamond, Nat. Nanotechnol. 7, 69 (2012).

[55] A. Faraon, C. Santori, Z. Huang, V. M. Acosta, and R. G. Beausoleil, Coupling of Nitrogen-Vacancy Centers to Photonic Crystal Cavities in Monocrystalline Diamond, Phys. Rev. Lett. 109, 033604 (2012).

[56] J. C. Lee, I. Aharonovich, A. P. Magyar, F. Rol, and E. L. Hu, Coupling of silicon-vacancy centers to a single crystal diamond cavity, Opt. Express 20, 8891 (2012).

[57] S. Meesala, Y.-I. Sohn, H. A. Atikian, S. Kim, M. J. Burek, J. T. Choy, and M. Lončar, Enhanced Strain Coupling of Nitrogen-Vacancy Spins to Nanoscale Diamond Cantilevers, Phys. Rev. Appl. 5, 034010 (2016).

[58] E. R. MacQuarrie, T. A. Gosavi, A. M. Moehle, N. R. Jungwirth, S. A. Bhave, and G. D. Fuchs, Coherent control of a nitrogen-vacancy center spin ensemble with a diamond mechanical resonator, Optica 2, 233 (2015).

[59] J. Kohler, J. A. Gerber, E. Dowd, and D. M. Stamper-Kurn, Negative-Mass Instability of the Spin and Motion of an Atomic Gas Driven by Optical Cavity Backaction, Phys. Rev. Lett. 120, 013601 (2018).

[60] J. V. Cady, O. Michel, K. W. Lee, R. N. Patel, C. J. Sarabalis, A. H. Safavi-Naeini, and A. C. B. Jayich, Diamond optomechanical crystals with embedded nitrogen-vacancy centers, Quantum Sci. Technol. 4, 024009 (2019).

[61] I. D. Leroux, M. H. Schleier-Smith, and V. Vuletić, Implementation of Cavity Squeezing of a Collective Atomic Spin, Phys. Rev. Lett. 104, 073602 (2010).

[62] C. M. Bowden and C. C. Sung, Cooperative behavior among three-level systems: Transient effects of coherent optical pumping, Phys. Rev. A 18, 1558 (1978).

[63] G. S. Agarwal, Master-equation approach to spontaneous emission. III. Many-body aspects of emission from two-level atoms and the effect of inhomogeneous broadening, Phys. Rev. A 4, 1791 (1971).

[64] H. Haffner, C. Roos, and R. Blatt, Quantum computing with trapped ions, Phys. Rep. 469, 155 (2008).

[65] H. A. Haus and J. A. Mullen, Quantum noise in linear amplifiers, Phys. Rev. 128, 2407 (1962).

[66] D. Meiser, J. Ye, D. R. Carlson, and M. J. Holland, Prospects for a Millihertz-Linewidth Laser, Phys. Rev. Lett. 102, 163601 (2009).

[67] A. Angerer, K. Streltsov, T. Astner, S. Putz, H. Sumiya, S. Onoda, J. Isoya, W. J. Munro, K. Nemoto, J. Schmiedmayer, and J. Majer, Superradiant emission from colour centres in diamond, Nat. Phys. 14, 1168 (2018).

[68] P. Groszkowski, M. Koppenhöfer, H.-K. Lau, and A. A. Clerk, Reservoir-engineered spin squeezing: Macroscopic even-odd effects and hybrid-systems implementations, Phys. Rev. X 12, 011015 (2022).

[69] A. V. Andreev, V. Gurarie, and L. Radzihovsky, Non-equilibrium Dynamics and Thermodynamics of a Degenerate Fermi Gas across a Feshbach Resonance, Phys. Rev. Lett. 93, 130402 (2004).

[70] R. A. Barankov and L. S. Levitov, Atom-Molecule Coexistence and Collective Dynamics near a Feshbach Resonance of Cold Fermions, Phys. Rev. Lett. 93, 130403 (2004).

[71] J. Keeling, Quantum corrections to the semiclassical collective dynamics in the Tavis-Cummings model, Phys. Rev. A 79, 053825 (2009).

[72] A. Szorkovszky, A. A. Clerk, A. C. Doherty, and W. P. Bowen, Detuned mechanical parametric amplification as a quantum non-demolition measurement, New J. Phys. 16, 043023 (2014).

[73] A. Metelmann and A. A. Clerk, Nonreciprocal photon transmission and amplification via reservoir engineering, Phys. Rev. X 5, 021025 (2015).

[74] M. Foss-Feig, K. R. A. Hazzard, J. J. Bollinger, and A. M. Rey, Nonequilibrium dynamics of arbitrary-range Ising models with decoherence: An exact analytic solution, Phys. Rev. A 87, 042101 (2013).

[75] A. McDonald and A. A. Clerk, Exact solutions of interacting dissipative systems via weak symmetries (2021), arXiv preprint, ArXiv:2109.13221.

[76] C. Bradac, M. T. Johnsson, M. van Breugel, B. Q. Baragiola, R. Martin, M. L. Juan, G. K. Brennen, and T. Volz, Room-temperature spontaneous superradiance from single diamond nanocrystals, Nat. Commun. 8, 1205 (2017).

[77] J. Ebel, T. Joas, M. Schalk, P. Weinbrenner, A. Angerer, J. Majer, and F. Reinhard, Dispersive readout of room temperature ensemble spin sensors, Quantum Sci. Technol. 6, 03LT01 (2021).

[78] D. Lee, K. W. Lee, J. V. Cady, P. Ovartchaiyapong, and A. C. B. Jayich, Topical review: Spins and mechanics in diamond, J. Opt. 19, 033001 (2017).

[79] D. A. Golter, T. Oo, M. Amezcua, I. Lekavicius, K. A. Stewart, and H. Wang, Coupling a surface acoustic wave to an electron spin in diamond via a dark state, Phys. Rev. X 6, 041060 (2016).

[80] S. Meesala, Y.-I. Sohn, B. Pingault, L. Shao, H. A. Atikian, J. Holzgrafe, M. Gündoğan, C. Stavrakas, A. Sipahigil, C. Chia, R. Evans, M. J. Burek, M. Zhang, L. Wu, J. L. Pacheco, J. Abraham, E. Bielejec, M. D. Lukin, M. Atature, and M. Lončar, Strain engineering of the silicon vacancy center in diamond, Phys. Rev. B 97, 205444 (2018).

[81] S. Maity, L. Shao, S. Bogdanovic, S. Meesala, Y.-I. Sohn, N. Sinclair, B. Pingault, M. Chalupnik, C. Chia, L. Zheng, K. Lai, and M. Lončar, Coherent acoustic control of a single silicon vacancy spin in diamond, Nat. Commun. 11, 193 (2020).

What is claimed is:

1. A method for quantum spin amplification, comprising:
spin-polarizing an ensemble of quantum spins in an initial spin state to generate a sensing spin state that is transversely polarized with respect to a quantization axis, the quantum spins identically having an upper energy state and a lower energy state;
accumulating, by the sensing spin state, a phase shift that transforms the sensing spin state into a phase-accumulated spin state having first and second transverse polarization components that are orthogonal to each other, the phase shift being based on an energy spacing between the upper and lower energy states;
transforming the phase-accumulated spin state into an intermediate spin state by rotating the first transverse polarization component into a longitudinal polarization component of the intermediate spin state;
coupling the ensemble of quantum spins to an auxiliary mode, wherein the intermediate spin state, in response to said coupling, evolves such that the second transverse polarization component is amplified into an amplified transverse polarization; and
measuring the amplified transverse polarization.

2. The method of claim 1, wherein:
said coupling induces collective dissipation of the ensemble of quantum spins; and
the intermediate spin state, in response to the collective dissipation, undergoes superradiant decay that amplifies the second transverse polarization component into the amplified transverse polarization.

3. The method of claim 1, wherein:
said coupling induces non-dissipative collective dynamics of the ensemble of quantum spins and the auxiliary mode; and
the intermediate spin state coherently evolves in response to the non-dissipative collective dynamics.

4. The method of claim 1, wherein said measuring comprises measuring the amplified transverse polarization along a measurement axis orthogonal to the quantization axis.

5. The method of claim 1, wherein said measuring comprises:
rotating the amplified transverse polarization into an amplified longitudinal polarization; and
measuring the amplified longitudinal polarization along the quantization axis.

6. The method of claim 1, wherein:
the upper and lower energy states are degenerate in the absence of an external electromagnetic field; and
the external electromagnetic field lifts the degeneracy of the upper and lower energy states.

7. The method of claim 1, wherein the upper and lower energy states are non-degenerate energy eigenstates of the quantum spins.

8. The method of claim 1, wherein said transforming the phase-accumulated spin state includes applying a pulse to the ensemble of quantum spins to rotate the phase-accumulated spin state around a rotation axis that is orthogonal to the quantization axis.

9. The method of claim 1, wherein said spin-polarizing includes applying a pulse to the ensemble of quantum spins to rotate the initial spin state around a rotation axis that is orthogonal to the quantization axis.

10. The method of claim 1, wherein the quantum spins identically have a spin quantum number equal to ½.

11. The method of claim 1, wherein the quantum spins identically have a spin quantum number that is greater than ½.

12. The method of claim 1, wherein the auxiliary mode is, or approximates, a bosonic mode.

13. The method of claim 12, wherein the bosonic mode is a lossy bosonic mode.

14. The method of claim 13, wherein said coupling includes strongly coupling the ensemble of quantum spins to the lossy bosonic mode.

15. The method of claim 1, further comprising applying, during said coupling, a dynamical decoupling sequence to the ensemble of quantum spins.

16. The method of claim 1, wherein said coupling includes coupling the ensemble of quantum spins to a resonant mode of a photonic cavity.

17. The method of claim 16, wherein said coupling includes:

turning on the collective dissipation by controlling the photonic cavity such that a transition between the upper and lower energy states is resonant with the resonant mode; and turning off the collective dissipation by controlling the photonic cavity such that the transition is not resonant with the resonant mode.

18. The method of claim 1, wherein said coupling the ensemble of quantum spins to an auxiliary mode includes coupling the ensemble of quantum spins to a mechanical mode.

19. The method of claim 1, wherein the quantum spins are selected from the group consisting of atoms, ions, nuclear spins, solid-state spins, nitrogen vacancy defect centers, silicon vacancy defect centers, and superconducting qubits.

20. A system for quantum spin amplification, the system being operable to perform the method of claim 1.

* * * * *